United States Patent
Kasuya et al.

(10) Patent No.: US 8,426,835 B2
(45) Date of Patent: Apr. 23, 2013

(54) CHARGED PARTICLE RADIATION DEVICE

(75) Inventors: Keigo Kasuya, Kokubunji (JP); Takashi Ohshima, Saitama (JP); Souichi Katagiri, Kodaira (JP); Masashi Kimura, Tokai (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/376,473

(22) PCT Filed: Jun. 15, 2010

(86) PCT No.: PCT/JP2010/003964
§ 371 (c)(1),
(2), (4) Date: Dec. 6, 2011

(87) PCT Pub. No.: WO2010/146833
PCT Pub. Date: Dec. 23, 2010

(65) Prior Publication Data
US 2012/0085925 A1    Apr. 12, 2012

(30) Foreign Application Priority Data
Jun. 16, 2009   (JP) .................................. 2009-143075

(51) Int. Cl.
*G21K 5/08*   (2006.01)
(52) U.S. Cl.
USPC .................... 250/515.1; 250/396 R; 250/397; 250/492.1; 250/492.2; 250/492.3
(58) Field of Classification Search .............. 250/396 R, 250/397, 492.1, 492.2, 492.3, 505.1, 515.1
See application file for complete search history.

(56) References Cited

U.S. PATENT DOCUMENTS

| 3,486,064 | A | * | 12/1969 | Stauffer ................... 313/231.01 |
| 4,295,072 | A | * | 10/1981 | Todokoro et al. ................. 313/7 |
| 2004/0124365 | A1 | | 7/2004 | Steigerwald |
| 2007/0102650 | A1 | * | 5/2007 | Katagiri et al. ............ 250/492.3 |
| 2008/0067377 | A1 | | 3/2008 | Hatakeyama et al. |

(Continued)

FOREIGN PATENT DOCUMENTS

| JP | 47-24756 A | 10/1972 |
| JP | 50-120765 A | 9/1975 |

(Continued)

OTHER PUBLICATIONS

Japanese Office Action received in Japanese Application No. 2011-519552 issued Dec. 18, 2012.

*Primary Examiner* — Michael Logie
(74) *Attorney, Agent, or Firm* — Mattingly & Malur, PC

(57) ABSTRACT

An electron gun that serves to reduce the quantity of electron stimulated desorption and accomplishes vacuum evacuation efficiently with a sufficient degree of vacuum. An electron source 1 and an extraction electrode 6 are provided for emitting an electron beam 7 from the electron source 1. A first vacuum chamber 16 containing the electron source 1 is connected to a second vacuum chamber 9 via an aperture 8 provided in the extraction electrode 6. Each vacuum chamber is differentially evacuated with an independent vacuum evacuation means, and the generation of electron stimulated desorption gas 11 is reduced by securing a wide route of vacuum evacuation around the electron source 1 and intercepting the procession of back scattered electrons 12 emitted from the area with the electron beam 7 on the extraction electrode 6 by using a shielding electrode 22 given a prescribed potential.

20 Claims, 26 Drawing Sheets

U.S. PATENT DOCUMENTS

| | | |
|---|---|---|
| 2008/0315122 A1 | 12/2008 | Katagiri et al. |
| 2009/0294697 A1* | 12/2009 | Katagiri et al. ............ 250/492.3 |
| 2011/0089336 A1 | 4/2011 | Kasuya et al. |

FOREIGN PATENT DOCUMENTS

| | | |
|---|---|---|
| JP | 55-1062 A | 1/1980 |
| JP | 63-139757 U | 9/1988 |
| JP | 7-65762 A | 3/1995 |
| JP | 9-17365 A | 1/1997 |
| JP | 2004-273419 A | 9/2004 |
| JP | 2007-157682 A | 6/2007 |
| JP | 2007-335125 A | 12/2007 |
| WO | 99/50651 A1 | 10/1999 |

* cited by examiner

V2<0

$0 \leqq V2 < V1$ $V1 \leqq V2$ $0 \leq V2 < V1$

V2 < 0

0 ≦ V2 < V1

V1≦V2

V2<0

0≦V2<V1

V1≦V2

V2=0

V2=V1

CHARGED PARTICLE RADIATION DEVICE

TECHNICAL FIELD

The present invention relates to a charged particle radiation device, such as an electron microscope or an electron beam lithographic device, having a charged particle radiation source.

BACKGROUND ART

A charged particle radiation device, such as a transmission electron microscope, a scanning electron microscope or an electron beam lithographic device, uses an electron gun to obtain an electron beam. There are a variety of electron guns including a cold field emission electron gun and a Schottky electron gun; each causes an electric field to concentrate on the tip of an electron beam by applying a high positive voltage (extraction voltage) to an extraction electrode opposed to an electron source having a sharp tip, and causes an electron beam to be emitted. The configuration of the electron gun is disclosed in, for instance, Patent Literature 1 through 3.

CITATION LIST

Patent Literature

Patent Literature 1: JP-A No. Sho 55-1062
Patent Literature: JP-A No. Sho 47-24756
Patent Literature: JP-A No. Hei 9-17365

SUMMARY OF INVENTION

Technical Problem

The stability of the quantity of the current of an electron beam (emission current) is greatly influenced by the degree of vacuum of the electron gun. Gas molecules are slightly remaining in the vacuum, and when they are adsorbed to the surface of the electron source or subjected to chemical reaction, the physical properties of the electron source surface change, resulting in a significant variation in the current quantity. Therefore, in order to stabilize the emission current, the degree of vacuum should be enhanced (the pressure should be brought down) to reduce the residual gas and thereby to decrease adsorption and chemical reaction on the electron source surface change. Usually, the pressure within the electron gun is kept at or below $10^{-7}$ (hereafter stated as 10E-7), and a high degree of vacuum (a low pressure) is thereby maintained.

The influence of the degree of vacuum is particularly conspicuous on field emission electron guns. Since the temperature of a field emission electron source is not above the normal level, residual gas is adsorbed and gradually covers the electron source surface. As a result, the emission current attenuates over a long period. Furthermore, since an increase in the quantity of adsorbed gas invites increased current variations (noise), it is necessary to remove adsorbed gas by periodically purifying the electron source surface. Methods of purification include flashing by which the electron source is heated to 2000° C. to thermally separate the adsorbed gas and field evaporation by which a high positive voltage is applied to the electron source to ionize the adsorbed gas. Because of this principle, the higher the degree of vacuum within the field emission electron gun, the lower the frequency of gas adsorption to the surface and the more stable the emission current that is obtained. Also, the frequency of purifying operations, such as flashing, can be reduced, resulting in greater convenience.

In order to keep the inside of an electron gun at an ultrahigh degree of vacuum not above 10 E-7 Pa, it is necessary to clear the electron gun of gas within with a vacuum pump for ultra high vacuum use and at the same time to reduce electron stimulated desorption (ESD) gas generated by the collision of emitted electrons against the extraction electrode and other members.

FIG. 1 is a diagram illustrating the mechanism of ESD gas generation in an electron gun. In this electron gun, an electron source 1 is held by a supporting part 2 and an insulator 3, and arranged within a vacuum vessel 4. The vacuum vessel 4 is cleared of gas with an ion pump 5 to maintain ultrahigh vacuum of not above 10 E-7 Pa within.

The electron source 1, an extraction electrode 6 arranged opposite thereto, and the vacuum vessel 4 are electrically insulated from one another; the vacuum vessel 4 is connected to the ground, and any desired voltage can be applied to the electron source 1 and the extraction electrode 6. When an extraction voltage positive relative to the extraction electrode 6 is applied to the electron source 1, the electric field concentrates at the tip of the electron source 1, and an electron beam 7 is radially emitted toward the extraction electrode. An aperture 8 is provided at the center of the extraction electrode 6, and the center of the electron beam 7 passes the aperture 8 toward a second vacuum chamber 9 underneath. The electrons in the central part having passed downward are referred to as a probe current 10, and the charged particle radiation device uses this probe current 10, being further selected, accelerated or focused according to the purpose.

Out of the electron beam 7, electrons in the peripheral part not passing the aperture 8 collide against the extraction electrode 6. These electrons that have collided hammer out the gas adsorbed onto the surface of the extraction electrode 6. This gas hammered out and emitted into the vacuum is referred as ESD (Electron Stimulated Desorption) gas 11. Irradiation with the electron beam causes this ESD gas 11 to be generated and the degree of vacuum in the electron gas to be deteriorated.

Out of the electron beam irradiating the extraction electrode 6, electrons of a certain proportion are reflected by electrons on the surface of the electrode or in the top shallow region, and bounced back upward in random directions. These electrons are referred to as back scattered electrons 12. The level of energy of each individual one of the back scattered electrons 12 differs from one to another. A few back scattered electrons are reflected by elastic collision, and hold the same respective levels of energy as at the time of incidence. On the other hand, a large majority of back scattered electrons are reflected by non-elastic collision and, deprived of their energy, have less energy than at the time of incidence.

Since the electron source 1 and the supporting part 2 have lower potentials than the extraction electrode 6, a repulsive force works on back scattered electrons approaching these elements. Therefore, only the back scattered electrons having the same levels of energy as at the time of incidence collide again against the electron source 1 or the supporting part 2. However, since most of the back scattered electrons are lower in energy level than at the time of incidence, they do not collide against the electron source 1 or the supporting part 2, proceed upward or sideways as their orbits are bent by repulsive force received from these elements and are directed toward the wall face of the vacuum vessel 4.

When back scattered electrons 12 collide against the wall face of the vacuum vessel 4 or other members in the electron gun, there again is generated ESD gas 11'. Further, a constant number of the back scattered electrons 12 that have collided are reflected again and scattered within the electron gun. The secondary and tertiary back scattered electrons generated in this manner are spread in a broad range within the electron gun, and cause ESD gas to be further generated. The ESD generated in these processes further worsens the degree of vacuum in the electron gun. Further, when back scattered electrons collide against the insulator 3 or some other element, the resultant charge-up causes electrical discharging to occur between the vacuum vessel 4 and the electron source 1 or elsewhere, and constitutes a cause for molten metal erosion of the electron source 1.

Methods of reducing ESD gas 11 generated from the extraction electrode 6 include, as described in Patent Literature 1 for instance, the thermal desorption method, by which the extraction electrode 6 is heated with a heating means such as a heater 13. When the extraction electrode 6 in vacuum is heated, adsorbed gas on the surface and gas within the surface layer of the extraction electrode 6 are thermally desorbed. Even if it is returned to normal temperature, as gas is already desorbed, the quantity of ESD gas generated by irradiation of the extraction electrode 6 with the electron beam 7 is smaller. Usually, the quantity of ESD gas generated from the extraction electrode 6 is kept to the minimum by applying in advance this thermal desorption method to the extraction electrode.

Other methods of reducing ESD gas include, as described in Patent Literature 2 for instance, the electron bombardment by which a large number of electrons are caused to collide against the extraction electrode in advance. According to this method, adsorbed gas and gas in the surface layer are hammered out and desorbed by discharging a large number of electrons from the electron source 1 or a newly provided electron source and bringing them to collision onto the surface of the extraction electrode in vacuum. Even if the extraction electrode 6 is irradiated with a usual electron beam 7 afterwards, the quantity of generated gas is smaller because gas on the surface is already desorbed. Like the thermal desorption method, the electron bombardment applied in advance to the extraction electrode can keep the generated ESD gas to the minimum.

However, since neither the thermal desorption method according to Patent Literature 1 nor the electron bombardment according to Patent Literature 2 can be applied to the wall face of the vacuum vessel 4 and all the members within the electron gun, it is difficult to reduce ESD gas 11' generated by back scattered electrons.

Patent Literature 1 discloses a configuration in which a cup-shaped extraction electrode is used. FIG. 2 shows in equipotential lines the distribution of electric fields when this cup-shaped electrode is used. As the distribution of electric fields here is symmetric with respect to the center axis, it is shown with respect to only a half of the face for the sake of brevity. The distribution of electric fields is so constituted as represented by equipotential lines 15 by the potentials of the electron source 1, the supporting part 2 and the cup-shaped extraction electrode 14. The back scattered electrons 12, when proceeding upward, are subjected by the distribution of electric fields to a force in a perpendicular direction with respect to these equipotential lines 15 and in a direction away from the electron source 1 and the supporting part 2. The back scattered electrons 12 are bent by this force in their proceeding direction and collided against a side face of the cup-shaped extraction electrode 14. Since the cup-shaped extraction electrode 14 is subjected in advance to the thermal desorption process or the like, the quantity of ESD gas generated by the collision of the back scattered electrons 12 is small. The greater the depth of the cup-shaped extraction electrode, the more the back scattered electrons colliding against the side face and the smaller the number of back scattered electrons proceeding upward past the cup. By this method, the number of back scattered electrons colliding against the vacuum vessel 4 and other members within the electron gun is reduced, and the quantity of ESD gas generated within the whole electron gun can be reduced.

Further, Patent Literature 3 discloses a configuration in which the whole electron source is covered by an extraction electrode. This method, making it difficult for back scattered electrons to come out of the inner space covered by the extraction electrode, can reduce the collision of back scattered electrons against the wall face of the vacuum vessel and other members.

The use of the cup-shaped electrode described in Patent Literature 1 or the structure of covering the electron source with the extraction electrode described in Patent Literature 3 can prevent back scattered electrons from spreading within the electron gun and colliding against the wall face of the vacuum vessel and other members in the gun to cause ESD gas to be generated. However, the route of vacuum evacuation around the electron source is narrowed to bring down conductance. In consequence, there arises a limit to the degree of vacuum attained around the electron source, making it difficult to obtain a more stable emission current. Furthermore, vacuum evacuation is made difficult and, once the degree of vacuum around the electron source deteriorates, recovery takes time, affecting the stability of the emission current. Also, the structure of Patent Literature 3, wherein the conductance is low and the distance between the electron source and the extraction current is short, involves the risk that even slight contamination of the metal holder and emitter bases separating them may invite electric discharge and damage the electron source.

An object of the present invention is to provide a charged particle radiation device which is improved in the degree of vacuum around the source of charged particles by shielding the procession of back scattered charged particles and sufficiently securing the route of evacuation around the source of charged particles, and can obtain a stable emission current.

Solution to Problem

As a form of achieving the object stated above, a charged particle radiation device has a charged particle source, an extraction electrode for extracting charged particles from the charged particle source, a sample holding means for holding a sample to be irradiated with charged particles extracted from the extraction electrode, a charged particle optical system for irradiating the sample held in the sample holding means with the charged particles that are extracted, a first evacuation means for evacuating a first vacuum chamber in which the charged particle source is arranged, and a second vacuum chamber, independent of the first vacuum chamber, for evacuating a second vacuum chamber connected to the first vacuum chamber, the charged particle radiation device further having a shielding electrode of a cylindrical structure that is so arranged as to surround the charged particle source and shield against the procession of back scattered charged particles from the extraction electrode, wherein the top end and the bottom end of the cylinder of the cylindrically structured shielding electrode are open to the inside of the first vacuum chamber.

Also, a charged particle radiation device has a charged particle source, an extraction electrode for extracting charged particles from the charged particle source, a sample holding means for holding a sample to be irradiated with charged particles extracted from the extraction electrode, a charged particle optical system for irradiating the sample held in the sample holding means with the charged particles that are extracted, a first evacuation means for evacuating a first vacuum chamber in which the charged particle source is arranged, and a second vacuum chamber, independent of the first vacuum chamber, for evacuating a second vacuum chamber connected to the first vacuum chamber, the charged particle radiation device further having a shielding electrode of a cylindrical structure that is so arranged as to surround the charged particle source and shield against the procession of back scattered charged particles from the extraction electrode, wherein at least one or more opening is provided in the side face of the cylinder of the cylindrically structured shielding electrode.

Advantageous Effects of Invention

By shielding against the procession of back scattered charged particles and sufficiently securing the route of evacuation around the charged particle source, a charged particle radiation device capable of enhancing the degree of vacuum around the charged particle source and obtaining a stable emission current can be provided.

DESCRIPTION OF EMBODIMENTS

In these embodiments, a shielding electrode is provided to prevent back scattered charged particles from spreading in a charged particle gun. Further, in order to sufficiently secure the route of evacuation around the source of charged particles, a shielding electrode having (1) a cylindrical structure of which the top and the bottom are open, (2) a cylindrical structure having an open part in the side face or (3) a structure containing (1) and (2) is used.

This makes it possible to provide a charged particle radiation device having a charged particle gun which serves to improve the degree of vacuum around the source of charged particles and to obtain a stable emission current.

Figure 21:
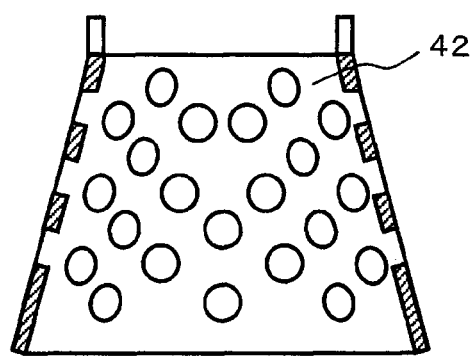
FIG. 21 is a diagram showing a modified version in which the shielding electrode in the third embodiment is tapered.
Figure 32:
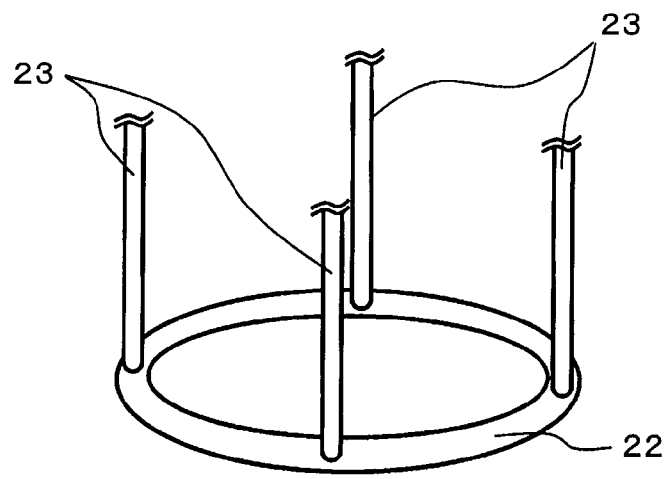
FIG. 32 is a perspective view of a cylindrical shielding electrode pertaining to the first embodiment.
Figure 34:
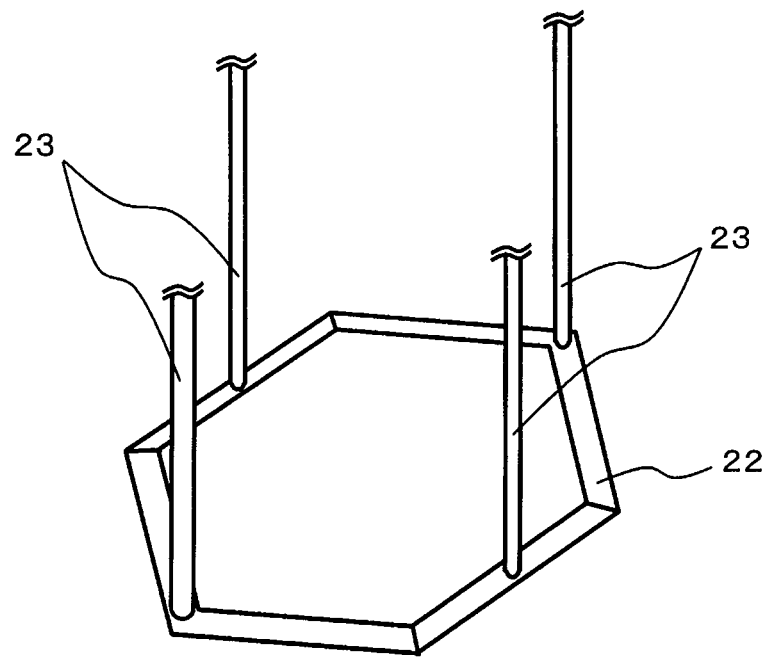
FIG. 34 is a perspective view of another cylindrical shielding electrode pertaining to the first embodiment.
Figure 36:
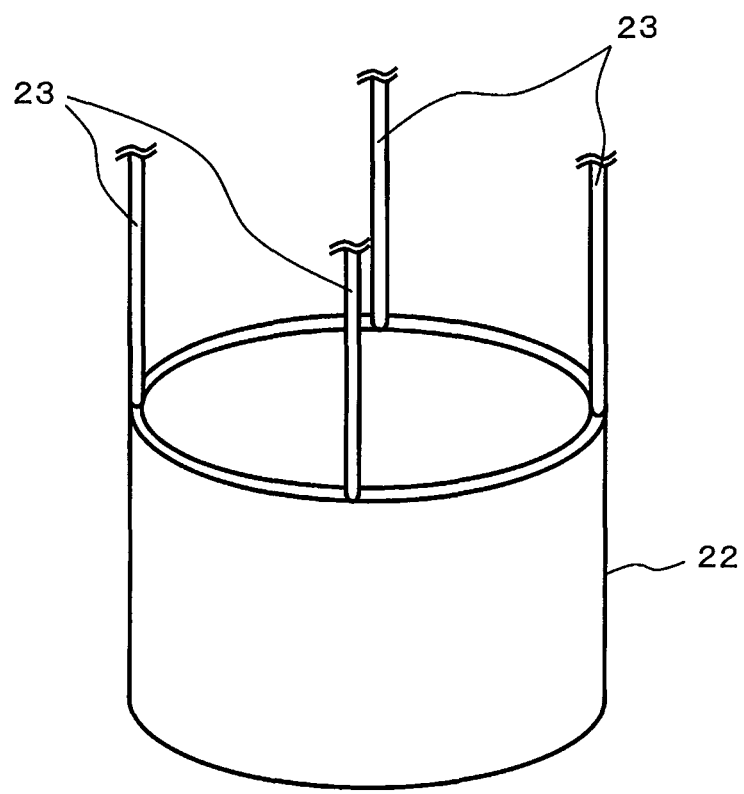
FIG. 36 is a perspective view of a cylindrical shielding electrode pertaining to the second embodiment.
Figure 37:
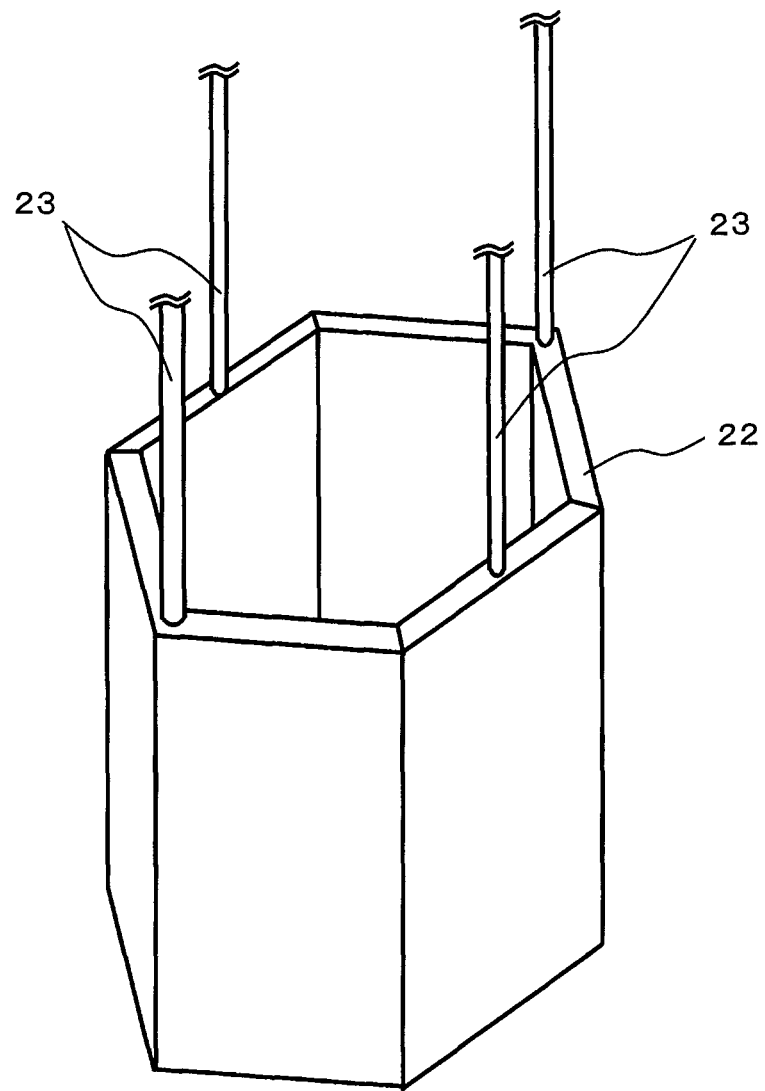
FIG. 37 is a perspective view of another cylindrical shielding electrode pertaining to the second embodiment.

The cylindrical structure here means a structure having a hollow. The cross-sectional shape cut by a plane perpendicular to the axial direction of the cylinder may not only be circular but also polygonal (FIG. 36 and FIG. 37). The length of the cylinder may also be less than the diameter of the cylinder (FIG. 32 and FIG. 34). The open part provided in the side face may also be such that the side face of the cylinder has an inclination relative to its central axis (FIG. 21).

A description will be given below with respect to the embodiments.

Embodiment 1

The first embodiment will be described with reference to FIG. 3 through FIG. 10 and FIG. 31 through FIG. 35.

Figure 1:
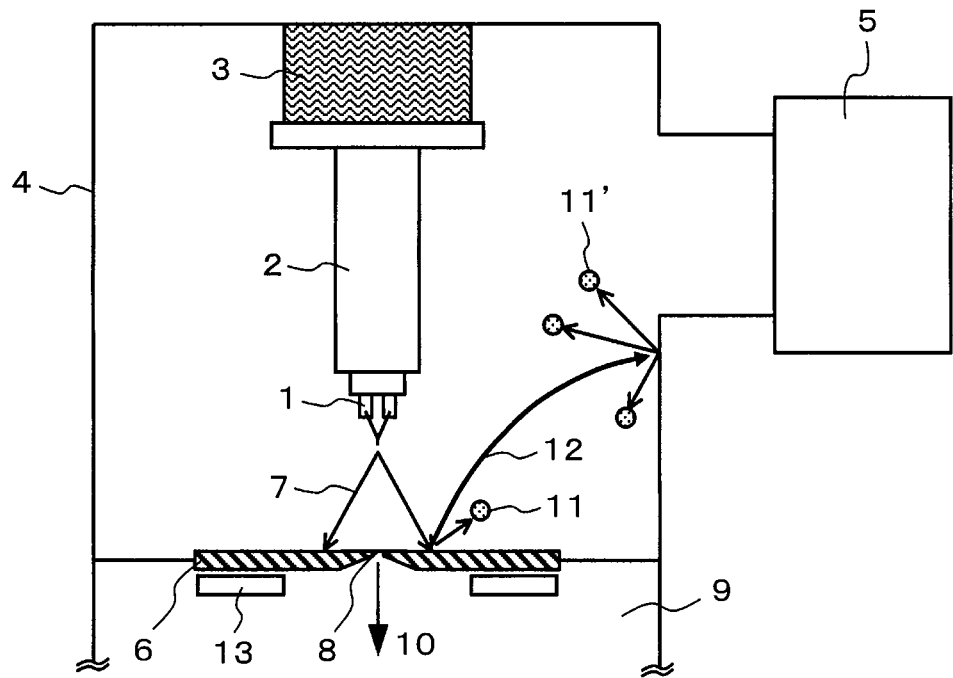
FIG. 1 is a schematic profile of an electron gun for illustrating a mechanism of generation of electron stimulated desorption gas by back scattered electrons.
Figure 2:
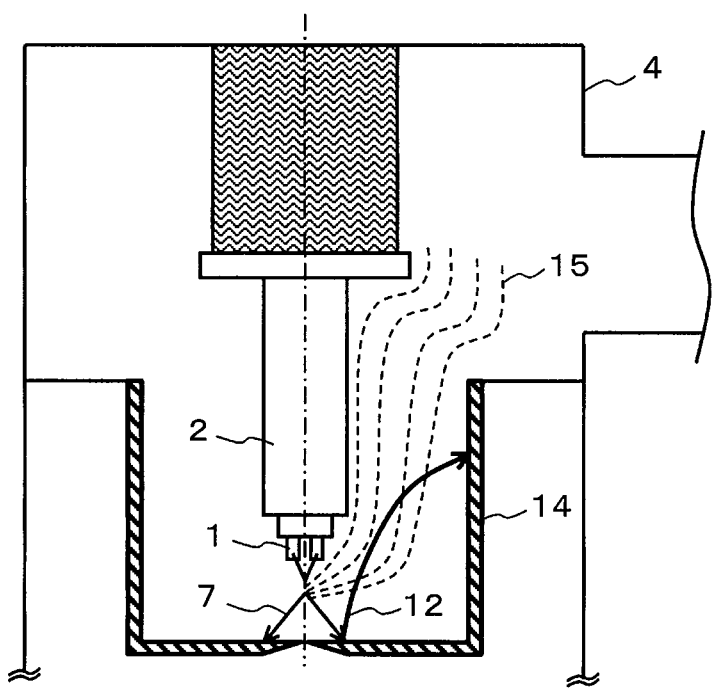
FIG. 2 is a profile of an electron gun for illustrating the distribution of electric fields in the electron gun having a cup-shaped extraction electrode.
Figure 3:
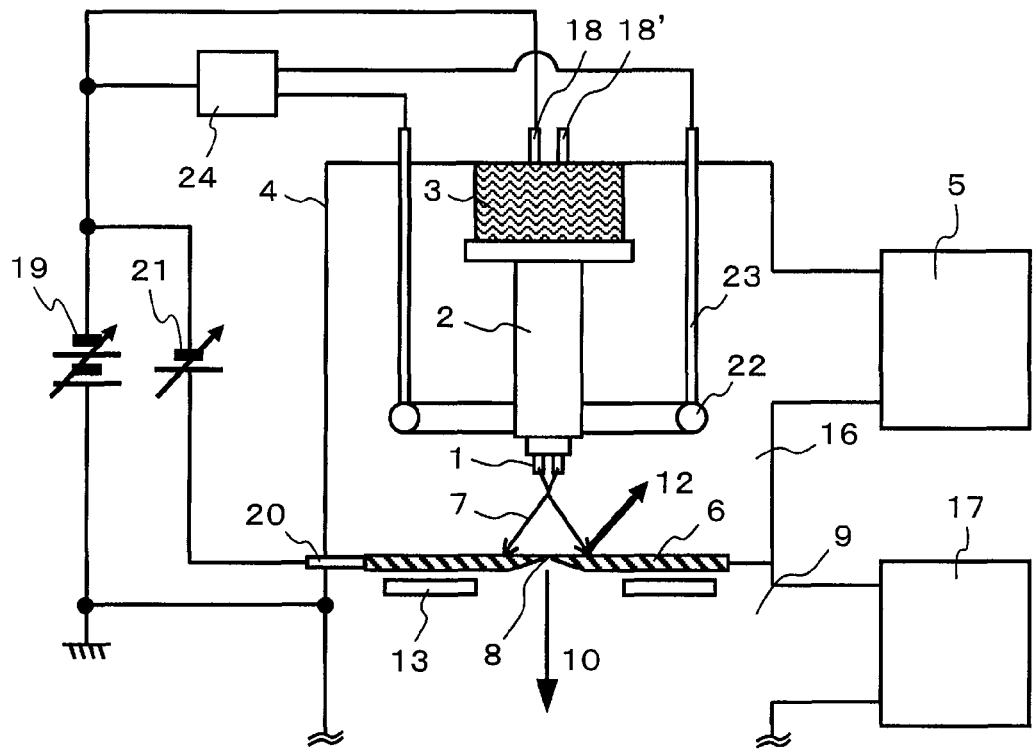
FIG. 3 is a configurational diagram of an electron gun pertaining to a first embodiment.
Figure 31:
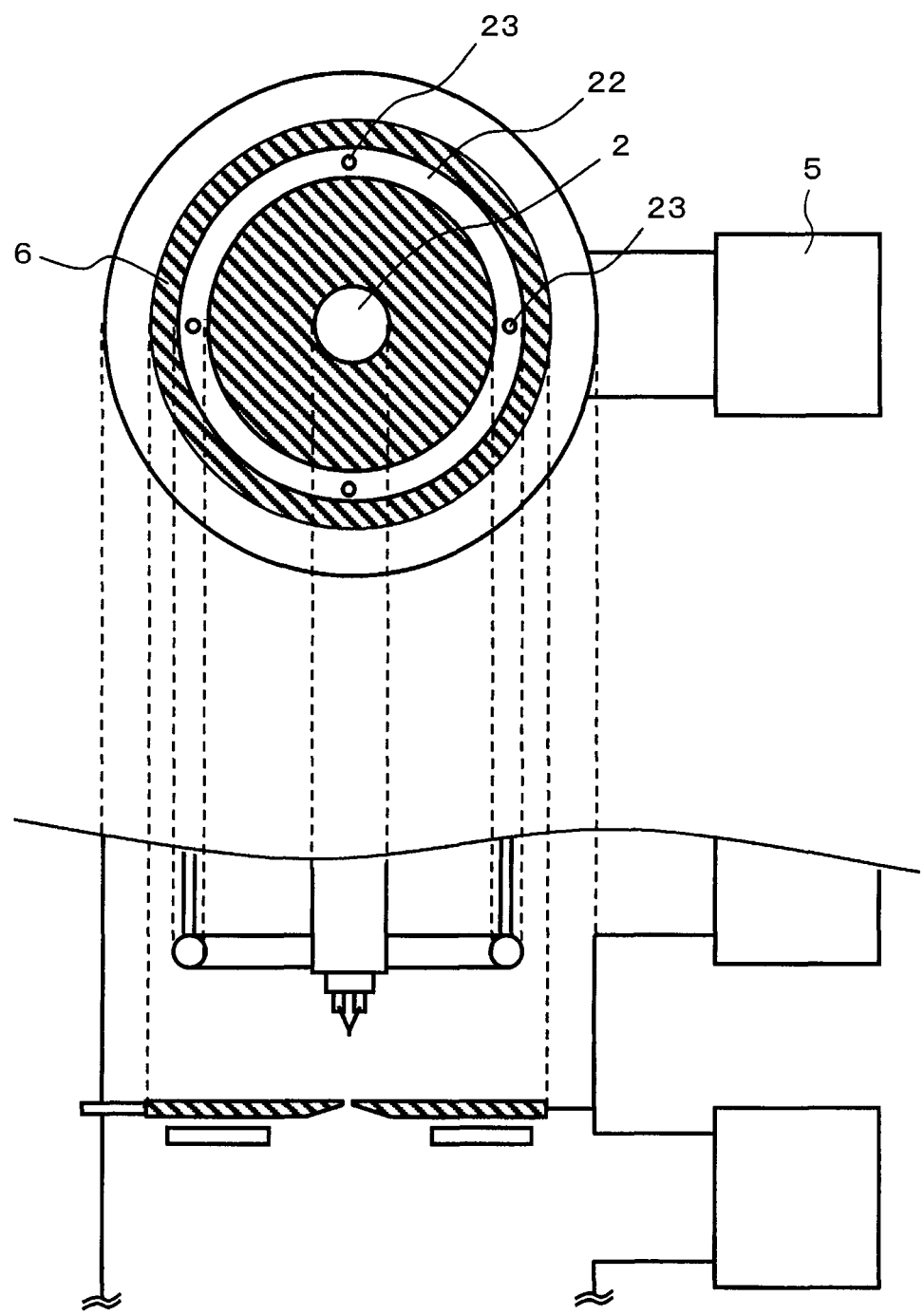
FIG. 31 comprises a top view and a profile of the electron gun pertaining to the first embodiment.

FIG. 3 shows a field emission electron gun for use in a charged particle radiation device pertaining to this embodiment. FIG. 31 comprises a front view of a cross-section of the electron gun seen from above and a profile. For an electron source 1, a cold field emission electron gun of tungsten which has a crystalline orientation of <310> or <111> and whose tip is sharpened from 50 nm to 300 nm in diameter is used. Also, a cold field emission electron gun of lanthanum hexaboride (LaB6), carbon nano tube or the like with a sharpened tip may be used. The electron source 1 is held by a supporting part 2 and an insulator 3, and arranged within a vacuum vessel 4. The vacuum vessel 4 is connected to the ground potential.

An extraction electrode 6 is arranged opposite and in a position about 10 mm away from the electron source 1. By this extraction electrode 6, the vacuum vessel 4 is separated into a first vacuum chamber 16 in which the electron source is arranged and a second vacuum chamber 9 underneath, the chambers being connected only via an aperture 8 provided at the center of the extraction electrode 6. The respective vacuum chambers are differentially evacuated by independent evacuation by an ion pump 5 and an ion pump 17, and the pressure in the first vacuum chamber 16 higher in the degree of vacuum is maintained at an ultrahigh degree of vacuum of not higher than 10 E-7 Pa. The ion pump 5 and the ion pump 17 may be other vacuum pumps than ion pumps, such as non-evaporative getter pumps or titanium sublimation pumps, which may as well be used in conjunction with an ion pump for evacuation. The distance between the electron source and the extraction electrode may be other than stated above, typically 1 to 50 mm.

The electron source 1 is electrically connected to a terminal 18 and a terminal 18', insulated from the vacuum vessel 4, and applies an acceleration voltage V0 to the ground potential by using an accelerating power source 19. The value of V0 varies with the velocity of the electron beam needed by the charged particle radiation device, typically V0=0 to 30 kV.

The extraction electrode 6 is electrically connected to a terminal 20 insulated from the vacuum vessel 4, and applies an extraction voltage V1 by using an extraction power source 21. The position of the terminal 20 can be selected as desired, and may be above the insulator 3 or on a side of the second vacuum chamber 9. The value of V1 is determined by the diameter of the tip of the electron source and the required quantity of the emission current; typically V1=1 to 7 kV is applied to the electron source 1. When V1 is applied, electric fields concentrate at the tip of the electron source 1, and the electron beam 7 is emitted.

Figure 4:
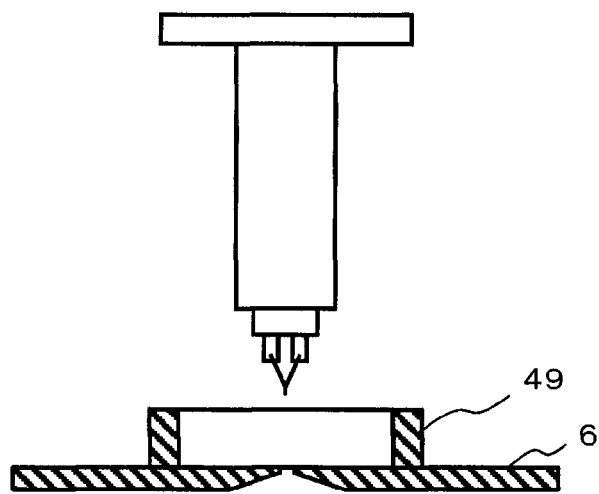
FIG. 4 is a diagram showing a modified version in which the extraction electrode of the first embodiment is provided with a protrusion.

If a circular protrusion 49 is so provided here as to surround the area irradiated by the electron beam on the upper face of the extraction electrode 6 as shown in FIG. 4, the distribution of electric fields created by the extraction electrode is brought closer to the electron source to facilitate concentration of fields at the tip and thereby to reduce the required V1. In order to secure the route of vacuum evacuation around the tip of the electron source, it is desirable to keep the height of the protrusion 49 smaller than the distance from the tip of the electron source to the extraction electrode, typically at or below 30 mm. The sectional shape of the protrusion may be rectangular, trapezoidal or polygonal otherwise.

Figure 5:
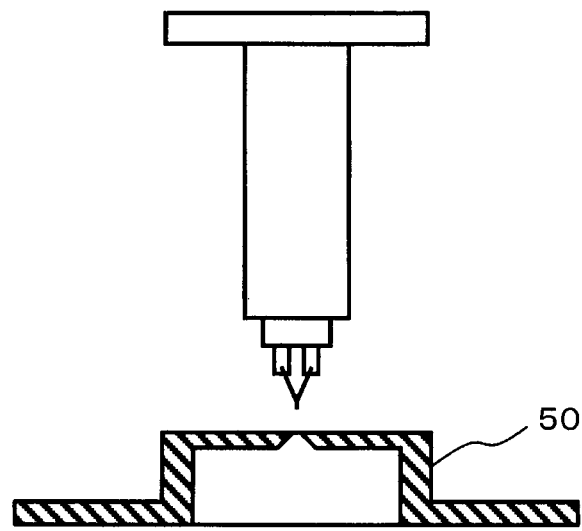
FIG. 5 is a diagram showing a modified version in which the extraction electrode of the first embodiment is in a convex shape.

In order to achieve an even distribution of electric fields around the electron source, the protrusion is given the same axis as the center axis of the electron beam and made axially symmetric. Also, it may have a structure of which only the area to be irradiated with the electron beam is concave relative to the surroundings like a dish. In other respects, a convex extraction electrode 50 having a convex shape toward the electron source as shown in FIG. 5 may be used as the extraction electrode. This electrode, too, can facilitate concentration of electric fields at the tip. Another protrusion 49 may further be provided on the upper face of the convex extraction electrode 50; the structure of the extraction electrode may be varied with the purpose as desired.

Electrons in the central part of the electron beam 7 pass the aperture 8 to the second vacuum chamber 9 underneath. These electrons in the central part having passed downward are referred to as a probe current 10, and this probe current 10 is further selected, accelerated and focused when it is used. The diameter of the aperture 8 is from 0.1 to 2 mm approximately, and a greater diameter than this range would make differential evacuation difficult.

The extraction electrode 6 is heated in advance to around 500° C. with a heating means such as a heater 13, and gas adsorbed to the surface or gas in the surface layer of the extraction electrode 6 is desorbed by a thermal desorption method. Performing the thermal desorption method in advance serves to reduce the quantity of ESD gas generated when the extraction electrode 6 is irradiated with the electron beam 7. Use of an electron bombardment as another method, by which the extraction electrode 6 is irradiated with a large dose of electron beam in advance, can also reduce the generation of ESD gas. When the electron bombardment is to be used, a new electron beam source for the electron bombardment may as well be provided within the vacuum vessel 4.

A shielding electrode 22 having an axially symmetric ring shape with a circular cross section of 1 mm in diameter (cylindrical structure) is so arranged as to surround the center axis of the electron beam 7. A perspective view of the ring-shaped (cylindrically structure) shielding electrode is shown in FIG. 32. The shielding electrode 22 restrains the generation of ESD gas by electrically or physically intercepting (shielding against) the orbit of back scattered electrons 12 reflected by the extraction electrode 6 and proceeding upward and thereby preventing them from colliding against the wall face of the vacuum vessel and other members.

The shielding electrode 22 is held by supporting rods 23 insulated from the vacuum vessel 4 and electrically connected. Although the number of the supporting rods is four here, the number may be one or any more. For the shielding electrode 22, a shielding voltage V2 is applied to the electron source 1 by using a shielding power source 24. V2 is typically −10 to 20 kV. The shielding power source 24 can electrify and heat the shielding electrode 22 by applying a current, and a thermal desorption process is also applied to the shielding electrode 22 by raising the temperature. The shielding electrode 22 may further be subjected to an electron bombardment.

The distribution of electric fields created by the shielding electrode 22 varies with the level of the shielding voltage V2 applied, and the way of bending the orbit of the back scattered electrons and the way of shielding vary. More specifically, the back scattered electrons are captured by pushing them back toward the extraction electrode by applying a repulsive force from the shielding electrode or causing them to collide against the shielding electrode by applying a gravitational force to the back scattered electrons. The number of electrons that can be shielded against and the extraction voltage needed for the emission of the electron beam vary with the level of the shielding voltage. Therefore, according to the design features of the overall configuration of the electron gun including the positions and structures of the electron source, the extraction voltage and the shielding voltage, the optimal V2 is appropriately determined.

How the way of shielding against the back scattered electrons varies with the shielding voltage V2 will be described below.

Figure 6:
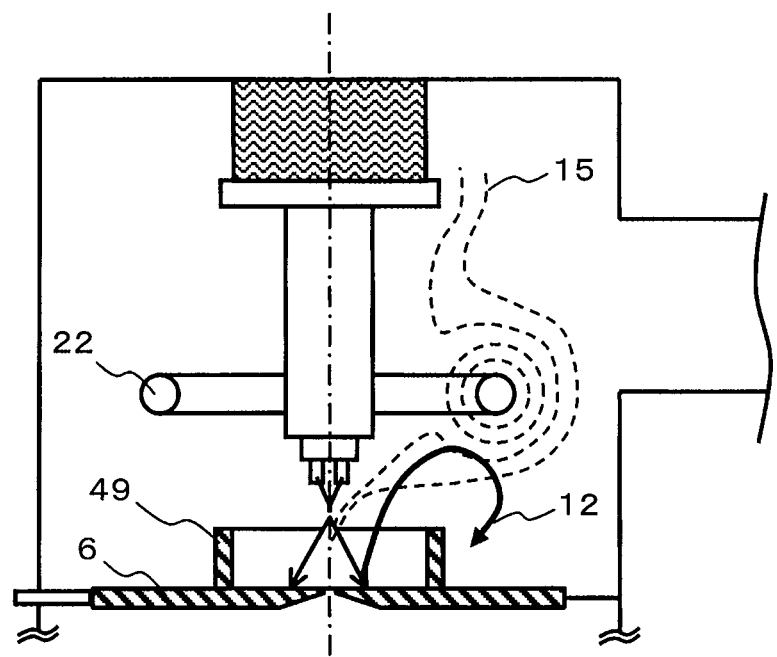
FIG. 6 is a diagram showing a modified version in which the potential of the shielding electrode is kept below the potential of the electron source in the first embodiment.

FIG. 6 shows a typical configuration of a case in which a voltage applied under a condition of the shielding voltage V2<0 and one example each of the equipotential lines 15 of the distribution of electric fields and of the orbit of the back scattered electrons 12. Incidentally, since the distribution of electric fields is symmetric with respect to the center axis, only a half face is shown for the sake of brevity. In the following diagrams illustrating the distribution of electric fields, too, a half face will be shown. Under the condition of V2<0, shielding is so accomplished as to restrain the back scattered electrons toward the inside of the shielding electrode. As the shielding electrode 22 is lower than the electron source 1 in potential, a large repulsive force works on the back scattered electrons 12 approaching the shielding electrode 22. Further, as the maximum energy the back scattered electrons 12 have is equal to the potential energy of the electron source 1, the back scattered electrons 12 do not collide against the shielding electrode 22. The back scattered electrons 12 are pushed back toward the extraction electrode 6 to intercept their procession, and are thereby prevented from colliding against the wall face of the vacuum vessel and the like. As the electron source 1 is surrounded by a distribution of electric fields below under this condition of application here, it is made difficult for the fields to concentrate at the tip. It is desirable to facilitate the concentration of fields by providing a protrusion 49 or the like on the extraction electrode 6.

The back scattered electrons pushed back by the repulsive force collide again against the extraction electrode. As the quantity of ESD gas generated from the extraction electrode is reduced by the thermal desorption method, the quantity of ESD gas generated is minimized. Also the secondary back scattered electrons generated in a trivial quantity generated by the reflection again of back scattered electrons by the extraction electrode is similarly pushed back to the extraction electrode by the repulsive force of the shielding electrode. Here, the extraction electrode 6 should be made sufficiently large with respect to the range of collision by the back scattered electrons that are pushed back to prevent them from colliding against other members not having gone through the thermal desorption process.

Figure 7:
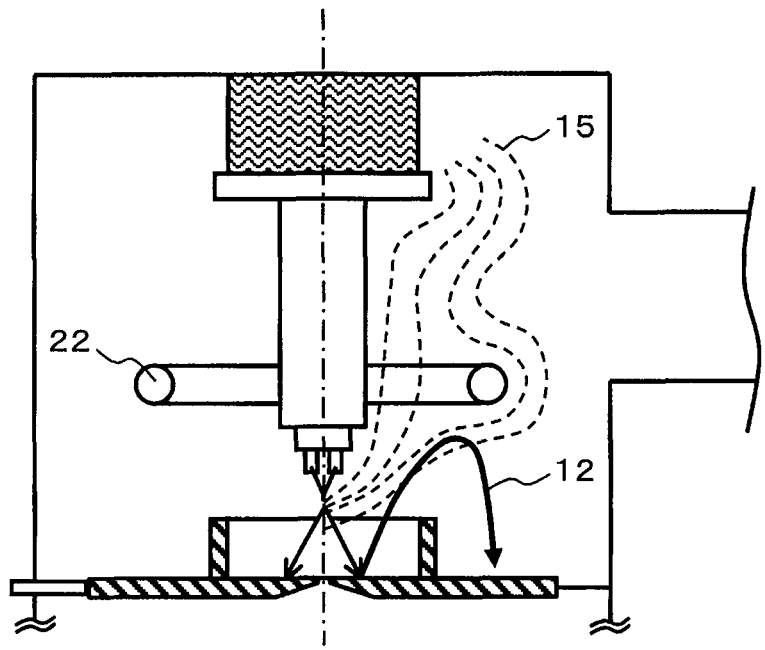
FIG. 7 is a diagram illustrating the distribution of electric fields where the potential of the shielding electrode is kept at or above the potential of the electron source and below the potential of the extraction electrode in the first embodiment.

FIG. 7 shows one example each of the equipotential lines 15 of the distribution of electric fields and of the orbit of the back scattered electrons 12 where the shielding electrode V2 is set to $0 \leq V2 < V1$. This condition of application has the advantage of making it easier to concentrate fields at the tip of the electron source than V2<0 and enabling the extraction voltage V1 to be reduced. The manner of shielding is, as in the case of V2<0, to apply a repulsive force to the back scattered electrons to restrain them toward the extraction electrode. However, since the potential of the shielding electrode 22 becomes higher than the electron source, some back scattered electrons having high energy collide against the shielding electrode. As the shielding electrode 22 is subjected to the thermal desorption process in advance, the quantity of ESD gas generated then is at its minimum. The repulsive force working on the back scattered electrons progressively weakens as V2 approaches V2, and stops working at V2=V1.

Figure 8:
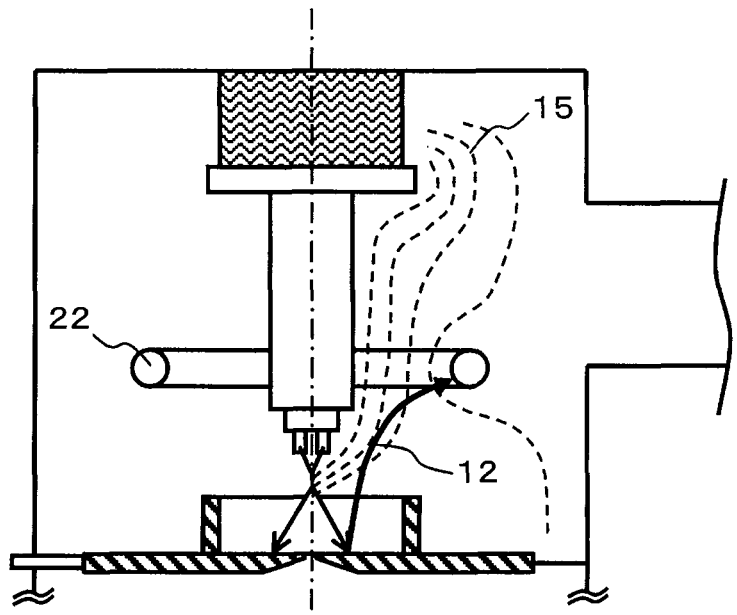
FIG. 8 is a diagram illustrating the distribution of electric fields where the potential of the shielding electrode is kept at or above the potential of the extraction electrode in the first embodiment.

FIG. 8 shows one example each of the equipotential lines 15 of the distribution of electric fields and of the orbit of the back scattered electrons 12 where the shielding electrode V2 is set to $V1 \leq V2$. This condition has an advantage of further facilitating, compared with the earlier condition of V2<V1, the concentration of fields on the electron source 1. Under this condition, a gravitational force works on the back scattered electrons 12 approaching the shielding electrode 22, and the electrons are pulled in by and collide against the shielding electrode. The back scattered electrons are subjected to shielding by positively causing the back scattered electrons to collide against the shielding electrode and capturing them. As the shielding electrode 22 is subjected to the thermal desorption process in advance, the ESD gas generated by the impact is at its minimum.

As described so far, the way of subjecting the back scattered electrons to shielding differs with the level of the applied voltage V2, and the relative ease of concentrating the fields at the tip of the electron source also varies. The condition of application is selected appropriately on the basis of the structure of the electron gun and the orbit of back scattered electrons matching it.

To cause the distribution of electric fields to work on many back scattered electrons, the position in which the cross section of the shielding electrode 22 is arranged is higher than the horizontal position of the face irradiated with electron beam on the extraction electrode (toward the electron source), a position overlooking this irradiated area.

Further, to reduce the influence of the distribution of electric fields of the shielding electrode on the concentration of fields at the tip of the electron source, preferably the shielding electrode should be kept away from the electron source by the distance from the tip of the electron source to the extraction electrode or more. Typically, the shielding electrode is kept away from the tip of the electron source by 10 mm or more, more restrictively by 20 mm or more. Therefore, the extraction electrode becomes the nearest electrode from the tip of the electron source.

Also, if the position of arrangement of the shielding electrode 22 were inside a columnar space having the area irradiated with the electron beam as its bottom and the center axis of the electron beam as its axis, the distance would be too long for back scattered electrons generated from the periphery of the irradiated area, making it difficult to apply a force. Especially under the condition of V2<V1, the repulsive force would positively direct them toward the wall face of the vacuum vessel. Therefore, the shielding electrode is arranged outside this columnar space.

The angle of emission of the electron beam emitted from the tip of the electron source, though depending on the level of the extraction voltage or the diameter of the tip of the electron source, typically is about 60°. Since, geometrically, the diameter of the area irradiated with the electron beam on the extraction electrode is about 1.5 times the distance from the tip of the electron source to the extraction electrode, the shielding electrode is kept away from the center axis at least 1.2 times, more restrictively at least twice. It is a columnar space of typically 6 mm, more restrictively 10 mm, in radius. Since back scattered electrons are reflected in random directions to proceed upward, the greater the distance from the irradiated face on the extraction electrode, the broader the range of space they spread into. Therefore, if the position of arrangement of the shielding electrode is farther than this irradiated area, back scattered electrons influenced by the distribution of electric fields will become fewer, making the shielding difficult. Typically, the shielding electrode is arranged within 70 mm, more restrictively within 50 mm, from the irradiated area.

The diameter of the ring here may be otherwise, typically about 0.1 to 10 mm to be used. Also, the cross section of the ring may be polygonal or oval.

Figure 9:
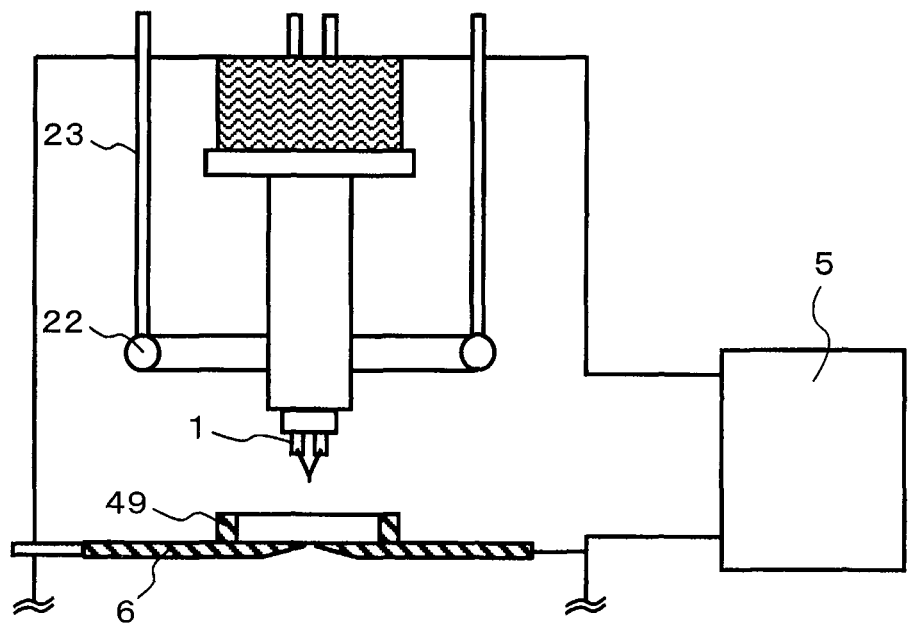
FIG. 9 is a configurational diagram of an electron gun in which the conductance of vacuum evacuation is enhanced in the first embodiment.

As shown in FIG. 9, by arranging the shielding electrode 22 not in the horizontal direction relative to the tip of the electron source 1 and arranging the ion pump 5 linearly in the horizontal position, the route of evacuation can be made wide and the distance between the electron source and the pump short, making it possible to ensured a high conductance. Further, use of an entrapment type pump such as a non-volatile getter pump or a titanium sublimation pump would eliminate the fear of chip contamination with emissions from the pump itself, resulting in greater effectiveness.

Furthermore, these pumps are more suitable for high vacuum evacuation than ion pumps, and can make the degree of vacuum attained higher. Use of this configuration enables that evacuating capability to be fully utilized and the degree of vacuum around the electron source to be enhanced to the degree of vacuum attained by these pumps. If the shielding electrode is not placed in the horizontal direction, it will be difficult to achieve sheltering from back scattered electrons oriented in the lateral direction from the extraction electrode, and therefore it is desirable to provide a protrusion 49 on the extraction electrode 6.

Use of less ESD gas generating materials, such as gold, silver, copper, aluminum, titanium or alloys thereof, as the material of the shielding electrode 22 or of its surface coating can serve to further reduce the quantity of generation at the time of electron collision. Also, use of a high magnetic permeability material, such as Permalloy, enables the influence of external magnetic fields, such as geomagnetism, on the electron beam to be reduced. Further, by coating the surface of the shielding electrode 22 with a getter material, such as a non-evaporative getter, the vacuum evacuation capacity within the electron gun is increased, enabling the degree of vacuum to be enhanced.

Depending on the condition of V2 application, a wide voltage difference may arise between the electron source 1 and the shielding electrode 22 or between the shielding electrode 22 and the extraction electrode 6, inviting electric discharge between the electrodes. Therefore, the discharge is restrained by setting the distance between these electrodes at or more than a certain length and increasing the curvatures of the end face and edge parts. Also, the arranged position and shape features including the diameter and size of the shielding electrode 22, the structures of the electron source and of the extraction electrode, or the positional relationships among the individual elements are optimized as appropriate by calculating the distribution of electric fields and the orbit of back scattered electrons.

Figure 10:
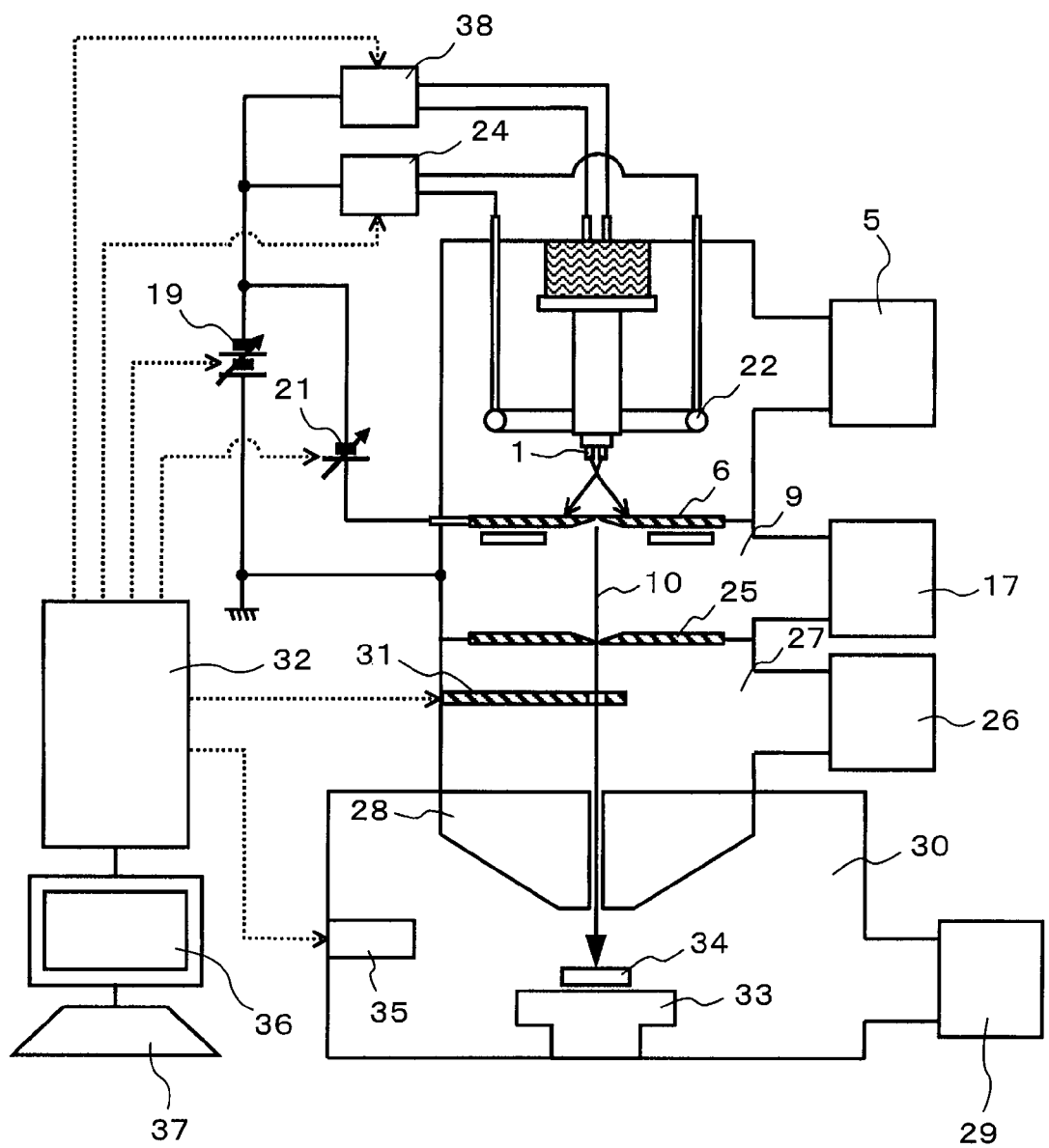
FIG. 10 is a configurational diagram of a scanning electron microscope pertaining to the first embodiment.

FIG. 10 shows an outline of a scanning electron microscope (SEM) as an example of charged particle radiation device using the electron gun of this embodiment. The electron gun is further connected via an accelerating electrode 25 to a third vacuum chamber 27 evacuated with an ion pump 26. The third vacuum chamber 27 is connected via an object lens 28 to a sample chamber 30 evacuated with a turbo molecular pump 29. Incidentally, the turbo molecular pump 29 can be substituted with some other vacuum pump, for instance a diffusion pump or the like.

The probe current 10 emitted from the electron gun is accelerated by the accelerating electrode 25, and proceeds to the third vacuum chamber 27. The probe current is further deprived of its outer circumferential part by a focusing electrode 31. At this time, the quantity of the current detected by the focusing electrode 31 is monitored. The probe current 10 is later focused by the object lens 28 and irradiates a sample 34 fixed on a sample stage 33.

Secondary electrons emitted from the sample 34 are detected with a detector 35, and their current quantity is monitored with a controller 32 to be converted into an observed image, which is displayed on a display 36. The accelerating power source 19, the extraction power source 21 and the shielding power source 24 are connected to the controller 32 and controls the applied voltages.

The controller 32 automatically adjusts these applied voltages on the basis of the quantity of the current detected by the focusing electrode 31. Otherwise, the detected quantity of the current and the present V0, V1 and V2 voltages or the pressure in the electron gun being displayed on the display 36, the user may use a manipulator 37 to adjust the voltages as desired. Flashing of the electron source 1 is accomplished by supplying electricity to and heating the electron source 1 with a flashing power source 38. Flashing may be accomplished by the controller 32 automatically on the basis of the current quantity and the length of time elapsed, or by displaying these factors on the display 36 and letting the user manually do it by using the manipulator 37.

By restraining with the shielding electrode the generation of ESD gas by back scattered electrons and securing the route of vacuum evacuation thereby to enhance conductance as in the configuration so far described, the degree of vacuum in the electron gun can be raised. Use of this electron gun enables a charged particle radiation device stable in emission current to be provided.

Figure 33:
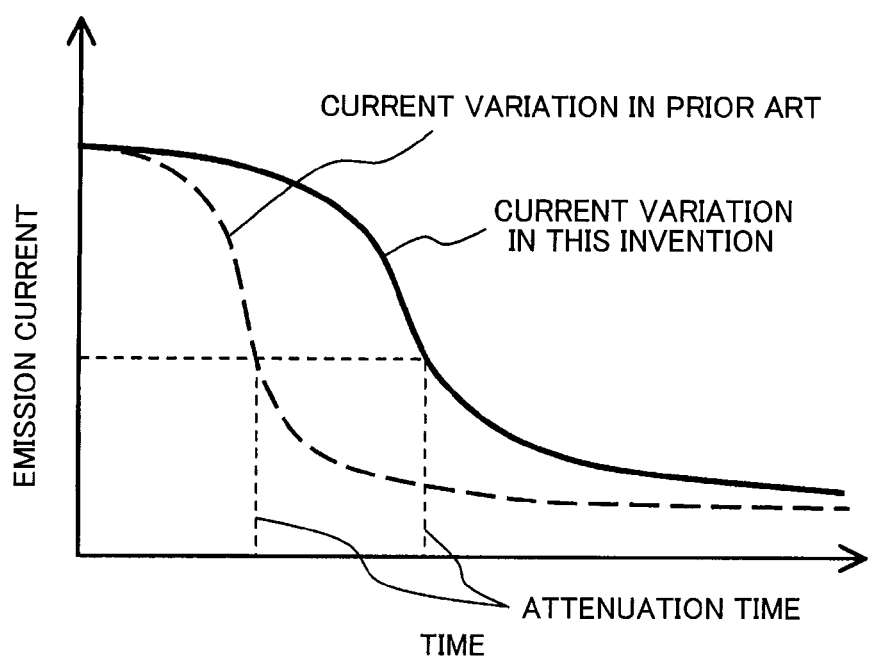
FIG. 33 is a diagram showing the variations of the emission current of the scanning electron microscope pertaining to the first embodiment.

FIG. 33 shows the variation over time of the emission current from the electron source pertaining to this embodiment used in an electron microscope. By enhancing the degree of vacuum around the electron source with this embodiment, the frequency of gas adsorption to the electron source is reduced, and the attenuation of the current is made more gradual. As a result, if for instance the attenuation time is defined to be the length of time taken by the current to become 50% of its initial value, the attenuation time of the emission current is made longer than in the prior art. As the time taken by the emission current to stabilize is extended, current fluctuations are also restrained and the frequency of flashing is reduced, the user's convenience is increased.

Figure 35:
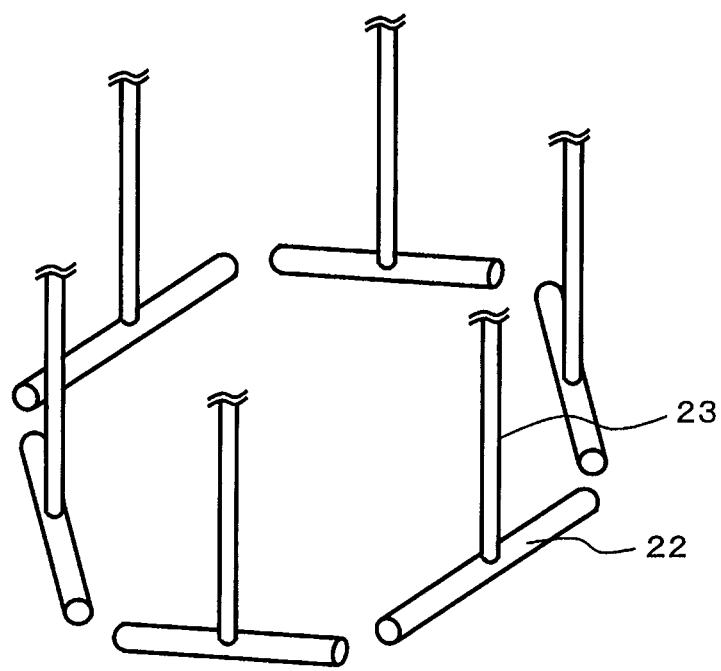
FIG. 35 is a perspective view of still another cylindrical shielding electrode pertaining to the first embodiment.

Although a ring shape is used for the shielding electrode in this configuration, some other shape is also enabled to give a shielding effect by forming a similar distribution of electric fields above the extraction electrode 6 for back scattered electrons. An axially symmetric hexagon so arranged as to surround the center axis of the electron beam 7 as shown in FIG. 34 may be used for instance, or some other polygon such as a triangle or a quadrangle may be used. The greater the number of corners, the more uniform the axially symmetric distribution of electric fields is formed, so that forces of uniform magnitude work on back scattered electrons reflected in any direction. Also, a plurality of electrodes of any desired shape, such as a non-ring shape, may be so arranged as to surround the center axis of the electron beam 7 as shown in FIG. 35 for instance. In this case, a voltage can be applied independently to each electrode to create any desired distribution of electric fields.

Although a field emitting electron gun has been described with respect to this configuration, a similar configuration can also be applied to a Schottky electron gun, a thermal cathode electron gun or the like. Further, this configuration can as well be applied to an ion gun which applies a positive voltage to a similar electron source and causes ions to be emitted. In addition, though the foregoing description of this configuration referred to an SEM as an example of application of the electron gun, it can also be mounted on other charged particle radiation devices, such charged particle radiation devices as a transmission electron microscope and an electron beam lithographic device.

This embodiment can provide a charged particle radiation device that can enhance the degree of vacuum around the electron source and enables a stable emission current to be obtained by shielding against the procession of back scattered electrons and sufficiently securing the route of evacuation around the source of charged particles by the use of a shielding electrode of a cylindrical structure whose upper end and lower end are open to the first vacuum chamber.

Further, by setting the distance from the tip of the charged particle source to the shielding electrode to a value surpassing the shortest distance from the tip of the charged particle source to the extraction electrode, the influence of the shielding electrode on the concentration of fields at the tip of the charged particle source can be reduced.

Further, by aligning the height of the evacuation port of the first vacuum chamber and the height of the tip of the charged particle source and making the height of the shielding electrode different from those heights, the conductance of evacuation can be increased and the degree of vacuum around the charged particle source can be enhanced.

Further, by providing a protrusion on the extraction electrode, the influence of the shielding electrode on the concentration of fields at the tip of the charged particle source can be reduced.

Embodiment 2

Now, a second embodiment will be described with reference to FIG. 11 through FIG. 15 and FIG. 36 through FIG. 38.

Regarding this embodiment, an electron gun characterized in that the shielding electrode has a cylindrical structure whose length is in the axial direction will be described. Although this configuration is substantially similar to Embodiment 1, the shielding electrode 22 is a cylindrical structure whose length is in the axial direction. As the distribution of electric fields is expanded more broadly, it has an advantage of an enhanced shielding effect against back scattered electrons.

Figure 11:
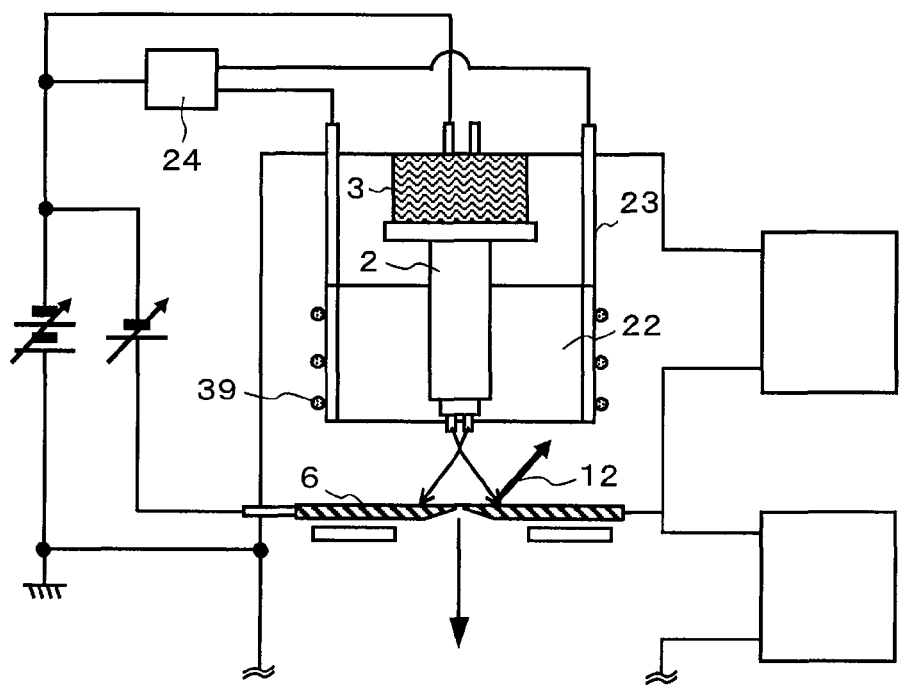
FIG. 11 is a configurational diagram of an electron gun pertaining to a second embodiment.

FIG. 11 shows the overall configuration of the electron gun of Embodiment 2. The configuration is substantially similar to Embodiment 1, and all the examples of modification, the examples of use and the method of mounting on the charged particle radiation device described with respect to Embodiment 1 also fit this embodiment. The shielding electrode 22 has a round cylindrical structure whose length is in the axial direction, is held by supporting rods 23, and a shielding voltage V2 is applied to it from the shielding power source 24.

FIG. 36 shows a perspective view of the shielding electrode 22 in a round cylindrical structure. Since the shielding electrode 22 has a round cylindrical structure and is long in the axial direction, the distribution of electric fields expands in a broader range. By fitting a heater 39 to the shielding electrode 22 and heating it in vacuum in advance, the thermal desorption process is carried out. The electron bombardment can give a similar effect. The extraction electrode 6 may be provided with a protrusion 49 and a convex extraction electrode 50 to facilitate concentration of fields at the tip of the electron source.

Figure 12:
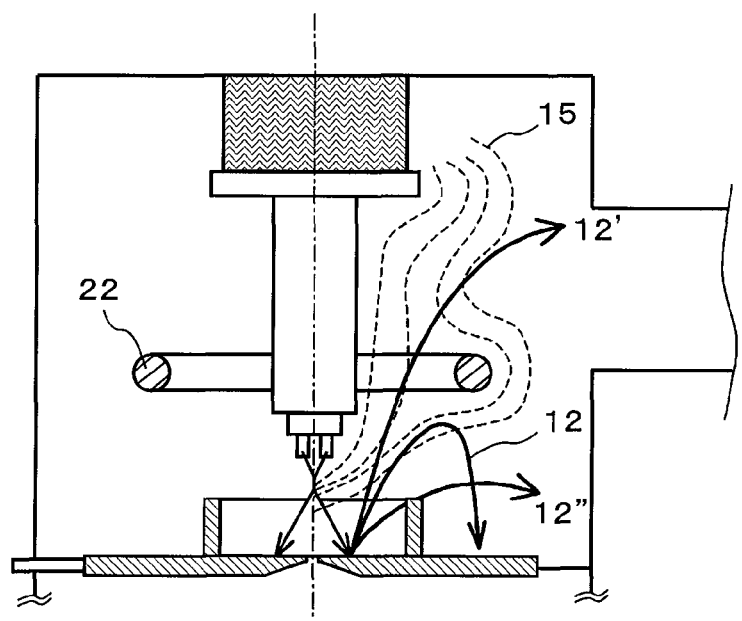
FIG. 12 is a diagram illustrating the distribution of electric fields where the potential of the shielding electrode is kept at or above the potential of the electron source and below the potential of the extraction electrode in the first embodiment.

FIG. 12 shows a plurality of loci of back scattered electrons under the condition of $0 \leq V2 < V1$. The ring-shaped shielding electrode, though it can shield against back scattered electrons approaching the shielding electrode 22, represented by back scattered electrons 12 in FIG. 12, can little influence back scattered electrons in positions away from the shielding electrode, represented by back scattered electrons 12' and 12", and finds difficulty in shielding. The same is true under other conditions of V2 application. Then, the shielding electrode, by having its length in the axial direction as shown in FIG. 11, achieves the expansion of the distribution of electric fields to a broader range and is enabled also to shield against back scattered electrons diverse in position, direction or energy.

The number of back scattered electrons that can be shielded against them is proportional to the solid angle covered by the shielding electrode as viewed from the area irradiated with electrons. Therefore, the greater the length of the round cylinder of the shielding electrode 22 in the axial direction, the higher the shielding effect. Also, the shielding electrode may be inclined relative to the center axis of the electron beam. However, the longer the round cylinder, the more the route of vacuum evacuation around the electron source blocked to deteriorate the conductance. To secure the route of vacuum evacuation around the electron source, the cylindrical shielding electrode is separated from the extraction electrode 6, the supporting parts 2 of the electron source and the insulator 3 above them, and the route of vacuum evacuation is secured by opening both the top part and the bottom part, or at least either of them, to provide a space. A high conductance can be thereby secured.

To add, as an example of arrangement of the shielding electrode to make compatible shielding against back scattered electrons and conductance for instance, arrangement of the shielding electrode 22 not in the horizontal direction relative to the tip of the electron source 1 with the ion pump 5 arranged linearly in the horizontal direction can be cited. Since ions on particulates generated by sputtering may come flying from the ion pump, use of an entrapment type pump such as a non-volatile getter pump or a titanium sublimation pump is advisable. Also, as shielding against horizontally directed back scattered electrons, such as the back scattered electrons 12" shown in FIG. 12, is difficult in this arrangement, it will be more effective to provide a protrusion 49 on the extraction electrode to block the orbit of the back scattered electrons.

Figure 13:
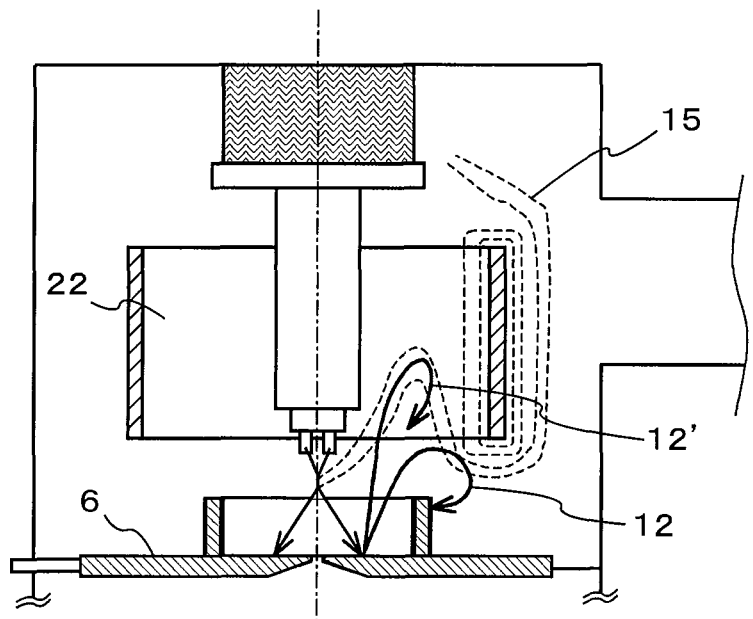
FIG. 13 is a diagram illustrating the distribution of electric fields where the potential of the shielding electrode is kept below the potential of the extraction electrode in the second embodiment.

FIG. 13 shows a typical distribution of electric fields in a case wherein a voltage is applied under the condition of V2<0. As in Embodiment 1, a repulsive force works on the back scattered electrons 12 approaching the shielding electrode 22 and pushes them back toward the extraction electrode 6. The round cylindrical shape of the shielding electrode 22 serves to expand the distribution of electric fields, and the space in which the repulsive force works on the back scattered electrons is also expanded. Therefore, there is a shielding effect against a greater number of back scattered electrons, including the back scattered electrons proceeding upward as represented by the back scattered electrons 12'.

Figure 14:
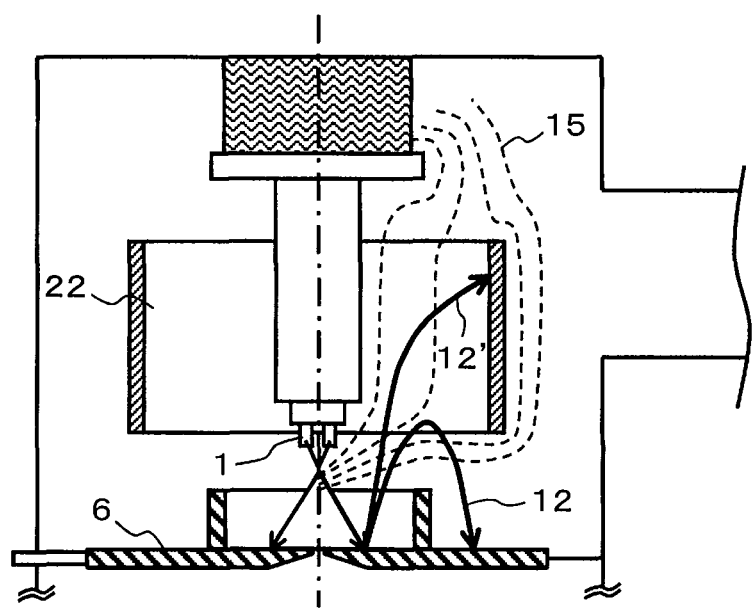
FIG. 14 is a diagram illustrating the distribution of electric fields where the potential of the shielding electrode is kept at or above the potential of the electron source and below the potential of the extraction electrode in the second embodiment.

FIG. 14 shows a typical distribution of electric fields in a case wherein the shielding voltage V2 is $0 \leqq V2 < V1$. This condition of voltage application has a common feature to V2<0 in that a repulsive force is brought to work on the back scattered electrons 12, and has an advantage of facilitating the concentration of fields at the tip of the electron source 1. Whereas high energy back scattered electrons collide against the shielding electrode 22, the round cylindrical shape and the resultant greater area of the shielding electrode 22 enables a greater number of back scattered electrons to be captured. As the shielding electrode 22 has undergone the thermal desorption process in advance, the ESD gas generated then by impact is at its minimum.

Figure 15:
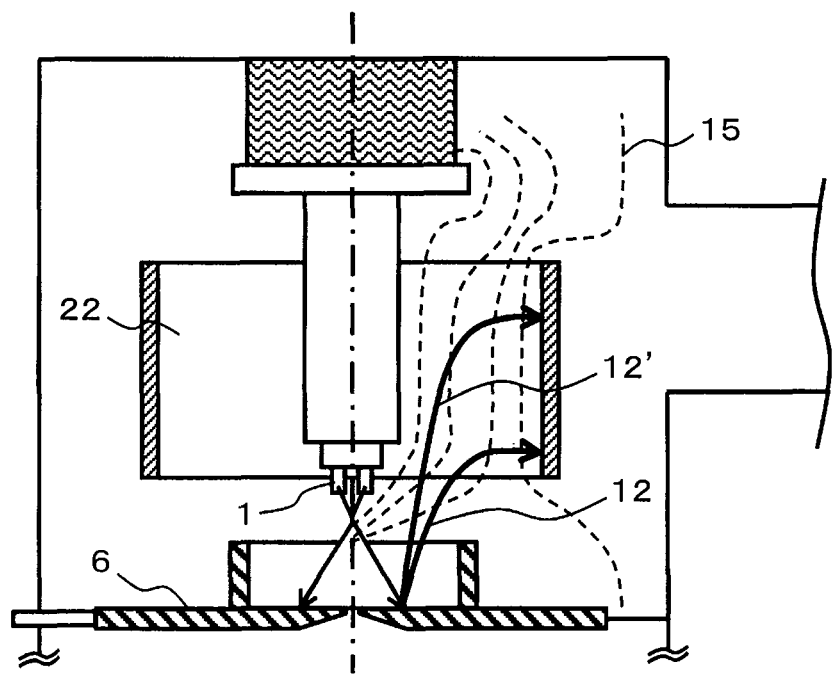
FIG. 15 is a diagram illustrating the distribution of electric fields where the potential of the shielding electrode is kept at or above the potential of the extraction electrode in the second embodiment.

FIG. 15 shows a typical distribution of electric fields in a case wherein the shielding voltage V2 is V1 V2. This condition has an advantage of facilitating the concentration of fields on the electron source 1 even more than the previous condition of V2<Vs. The use of the round cylindrical structure of the shielding electrode applies a gravitational force on the back scattered electrons 12 approaching the shielding electrode 22 in a broader range, and enables a greater number of back scattered electrons to be captured. As the shielding electrode 22 has undergone the thermal desorption process in advance, the ESD gas generated then by impact can be kept to the minimum.

The position of arrangement of the shielding electrode is the same as in Embodiment 1. Since the distribution of electric fields is expressed in the superposition of minute electric charges, even if the shape of the shielding electrode is different, a similar effect can be achieved if part of it is arranged in the space indicated with respect to Embodiment 1.

Figure 38:
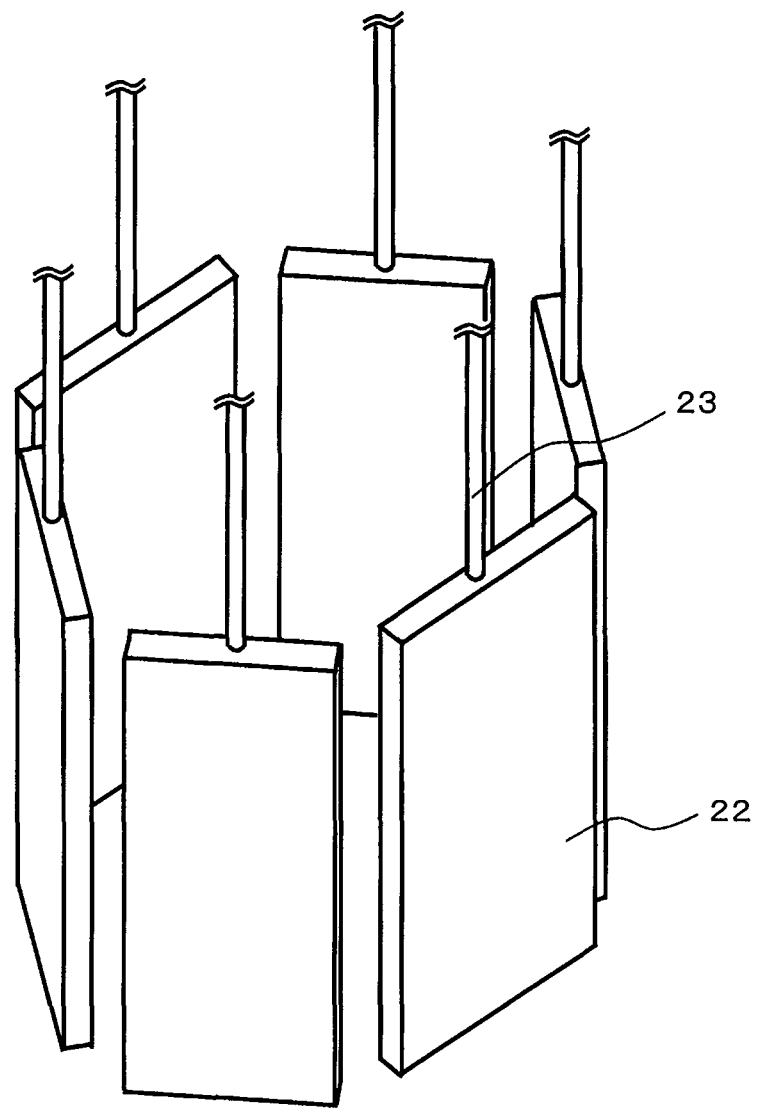
FIG. 38 is a perspective view of still another cylindrical shielding electrode pertaining to the second embodiment.

The shape of the shielding electrode is not limited to a round cylindrical structure, but may as well be a hexagonal cylinder as shown in FIG. 37, or a triangular or quadrangular cylinder. The greater the number of corners, the more uniform the axially symmetric distribution of electric fields is formed, so that forces of uniform magnitude work on back scattered electrons reflected in any direction. For practical purposes, a hexagon or a shape having more corners is desirable. Also, a plurality of electrodes of any desired shape may be arranged as shown in FIG. 38. In this case, a voltage can be applied independently to each electrode to create any desired distribution of electric fields.

Use of the configuration so far described makes it possible to provide an electron gun whose distribution of electric fields created by the shielding electrode is more expanded, which can shield against a greater number of back scattered electrons and is further reduced in the quantity of ESD gas generated than Embodiment 1.

This embodiment can provide a charged particle radiation device that can enhance the degree of vacuum around the electron source and enables a stable emission current to be obtained by preventing the spread of back scattered electrons within the charged particle gun and sufficiently securing the route of evacuation around the source of charged particles by the use of a shielding electrode of a cylindrical structure whose two ends are open. Further, use of a cylindrical structure whose length is in the axial direction makes it possible to provide a charged particle radiation device having a high shielding effect against a broader range of back scattered electrons.

Embodiment 3

Now, a third embodiment will be described with reference to FIG. 16 through FIG. 24 and FIG. 39. Regarding this embodiment, an electron gun characterized in that the shielding electrode in the cylindrical structure of Embodiment 2 has an opening in its side face. This configuration, by virtue of the expansion of its distribution of electric fields to a broader range in the same way as in Embodiment 2, can shield against many back scattered electrons, and has a characteristic that the presence of the opening can enhance the conductance of vacuum evacuation.

Figure 16:
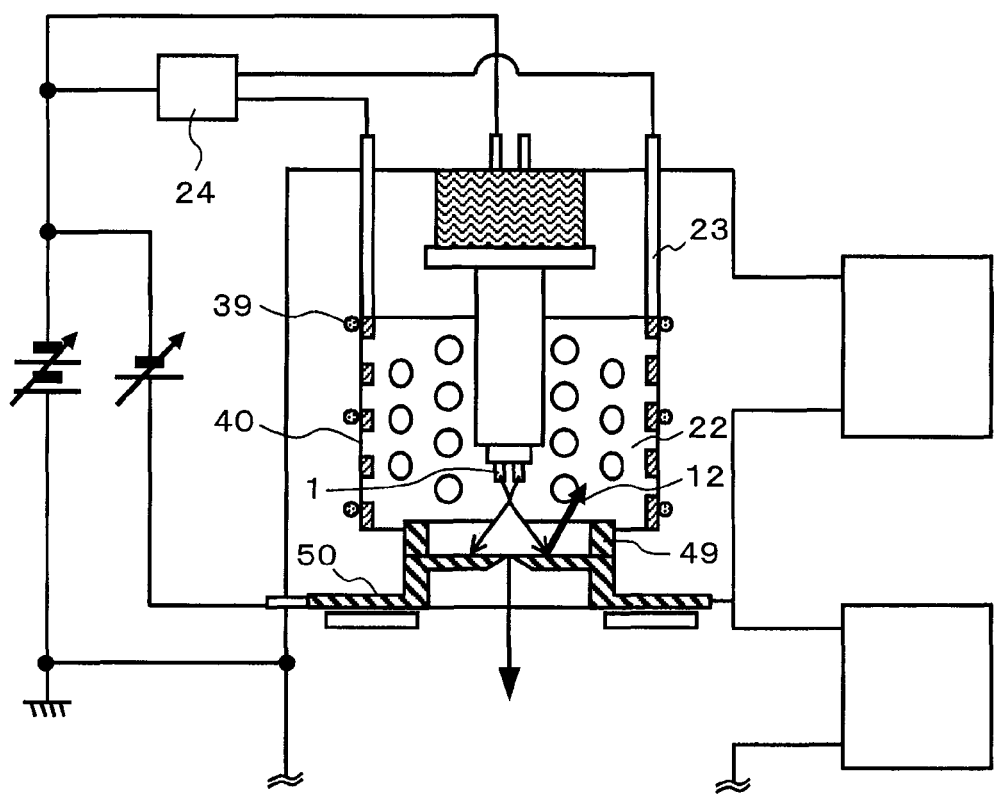
FIG. 16 is a configurational diagram of an electron gun pertaining to a third embodiment.
Figure 39:
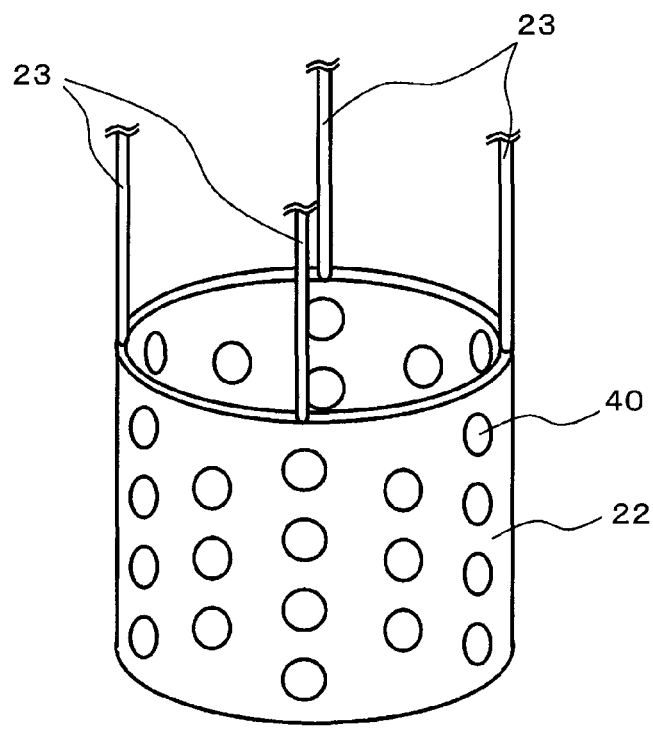
FIG. 39 is a perspective view of a cylindrical shielding electrode pertaining to the third embodiment.

FIG. 16 shows the overall configuration of the electron gun of Embodiment 3. The configuration is substantially similar to Embodiment 1 and Embodiment 2, and all the examples of modification, the examples of use and the method of mounting on the charged particle radiation device described with respect to Embodiments 1 and 2 also fit this embodiment. The shielding electrode 22 in this embodiment has a round cylindrical structure, and has an opening 40 in its side face. FIG. 39 shows a perspective view of the shielding electrode of the round cylindrical structure having the opening in its side face. The shielding electrode 22 is held by supporting rods 23, and a shielding voltage V2 is applied to it from the shielding power source 24. The shielding electrode 22 is fitted with a heating means such as a heater 39 for the thermal desorption process. The extraction electrode used here is a convex extraction electrode 50 provided with a protrusion 49 to more concentrate electric fields at the tip of the electron source 1. The structure of the extraction electrode may be any one of those described with reference to FIG. 3 through FIG. 5.

Incidentally, where the convex extraction electrode 50 is used, by extending the shielding electrode 22 to underneath the horizontal height of the surface of the convex extraction electrode 50, the distribution of electric fields is enabled to apply a force even to back scattered electrons whose orbit is bent to direct them to the vicinities of the side of the convex extraction electrode, resulting in greater shielding ease.

Since the shielding electrode 22 has a round cylindrical structure and is long in the axial direction, the range of distribution of electric fields is expanded as in Embodiment 2, and effectively shields against back scattered electrons. Although elongation of the round cylinder in Embodiment 2 to enhance the shielding effect would narrow the route of vacuum evacuation around the electron source and invite deterioration of conductance, the presence of the opening 40 anew in this embodiment serves to secure the route of vacuum evacuation while shielding against back scattered electrons, resulting in an enhanced conductance. Even if the shielding electrode is arranged in the horizontal direction of the electron source 1 for instance, the conductance can be maintained. While the distribution of electric fields in the vicinities of the opening becomes uneven according to the shape of the opening, the distribution of electric fields becomes even, as in the absence of the opening, with an increase in the distance from the shielding electrode. Therefore, the force given to the back scattered electrons is not affected as in Embodiment 2.

Figure 17:
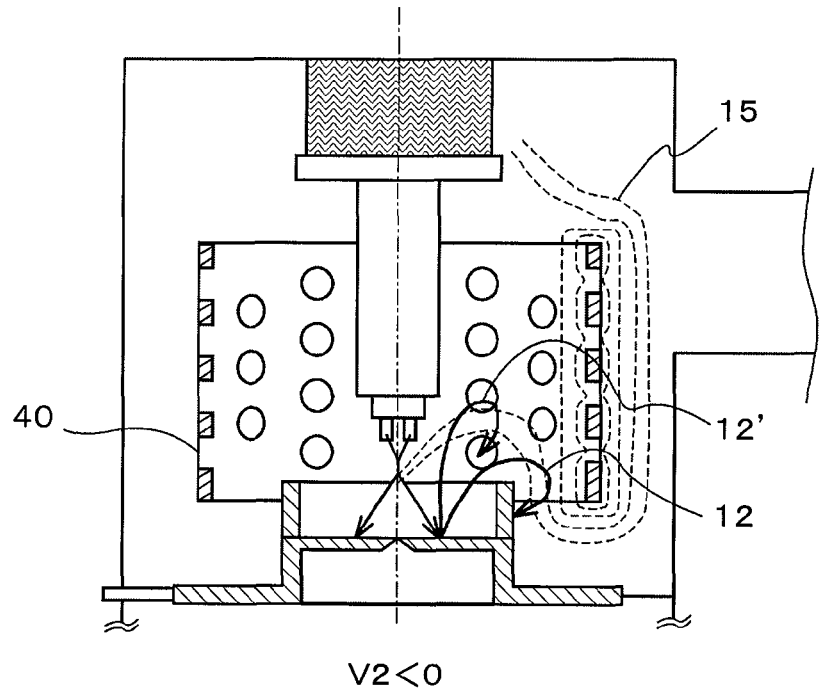
FIG. 17 is a diagram illustrating the distribution of electric fields where the potential of the shielding electrode is kept below the potential of the electron source in the third embodiment.

FIG. 17 shows a typical distribution of electric fields in a case wherein a voltage is applied under the condition of V2<0. Although the distribution of electric fields in the vicinities of the opening 40 becomes somewhat uneven, it becomes even with an increase in the distance from the shielding electrode, and a repulsive force is given to the back scattered electrons for shielding against them.

Figure 18:
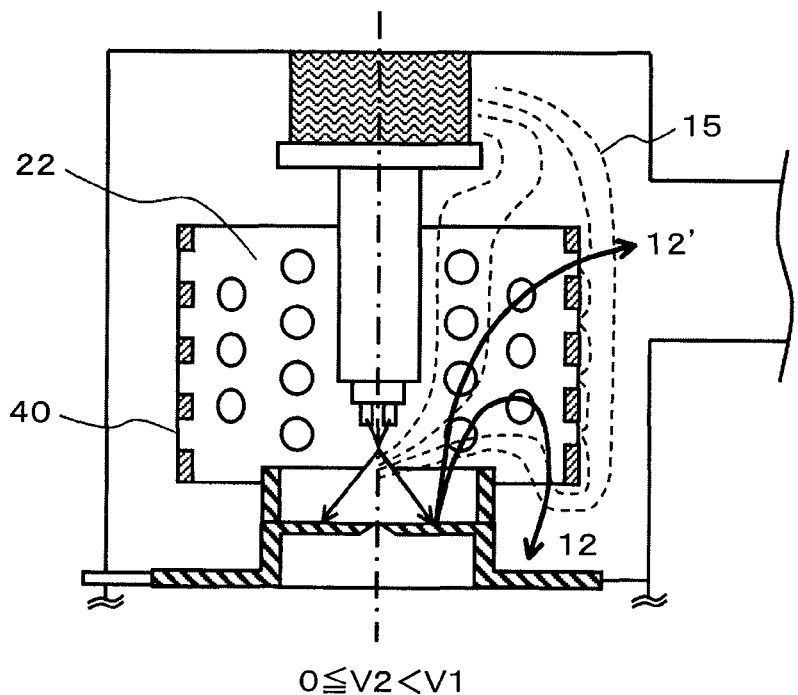
FIG. 18 is a diagram illustrating the distribution of electric fields where the potential of the shielding electrode is kept at or above the potential of the electron source and below the potential of the extraction electrode in the third embodiment.

FIG. 18 shows a typical distribution of electric fields in a case wherein the shielding voltage V2 is $0 \leqq V2 < V1$. Under this condition of voltage application, some of the back scattered electrons collide against the shielding electrode 22. Since the opening 40 is provided in the shielding electrode 22, some of the electrons, as represented by the back scattered electrons 12', may pass this opening then and collide against the wall face of the vacuum vessel 4. In view of this possibility, by altering the structure of the shielding electrode 22 as described below, the probability of successful shielding against the back scattered electrons (shielding rate) is enhanced. For instance, the back scattered electrons 12 are captured by providing a protrusion 41 on the opening 40. Also, by inclining the protrusion 41 on the basis of the loci of the back scattered electrons 12 figured out by calculation, the shielding rate can be further enhanced.

Figure 20:
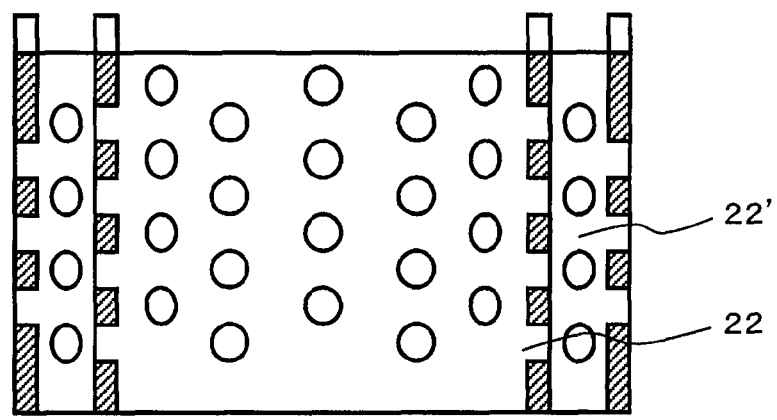
FIG. 20 is a diagram showing a modified version in which the shielding electrode in the third embodiment is made multiple.

Further, as shown in FIG. 20, two or more shielding electrodes 22 and 22' are provided in a telescopic way, and the position of the opening 40 of each is positioned out of alignment with those of others. This arrangement serves to capture those of the back scattered electrons 12 having passed the inner shielding electrode 22 with the outer shielding electrode 22' and thereby enhance the shielding rate. Further, it is also possible to enhance the shielding rate by electrically insulating the plurality of shielding electrodes from one another and independently varying the voltage applied to each.

Further, the shielding rate can also be raised by using a shielding electrode 42 inclined (tapered) relative to the center axis of the electron beam as shown in FIG. 21 and thereby varying the distribution of electric fields in the shielding electrode.

Figure 19:
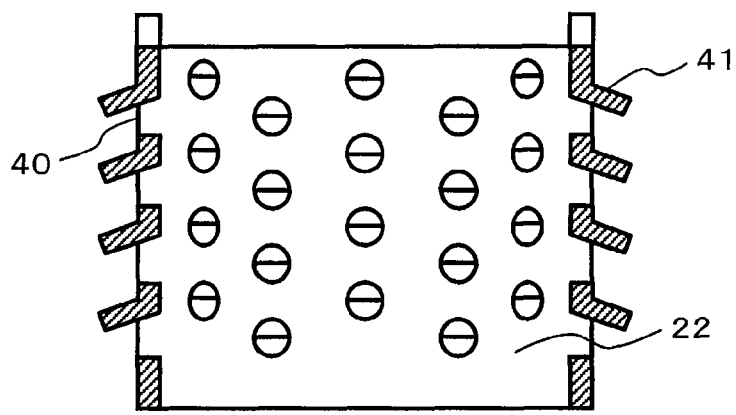
FIG. 19 is a diagram showing a modified version in which the shielding electrode in the third embodiment is provided with a protrusion.

The electrode structures for raising the shielding rate shown in FIGS. 19 through 21 above can also be used in combination of one and any other.

Figure 22:
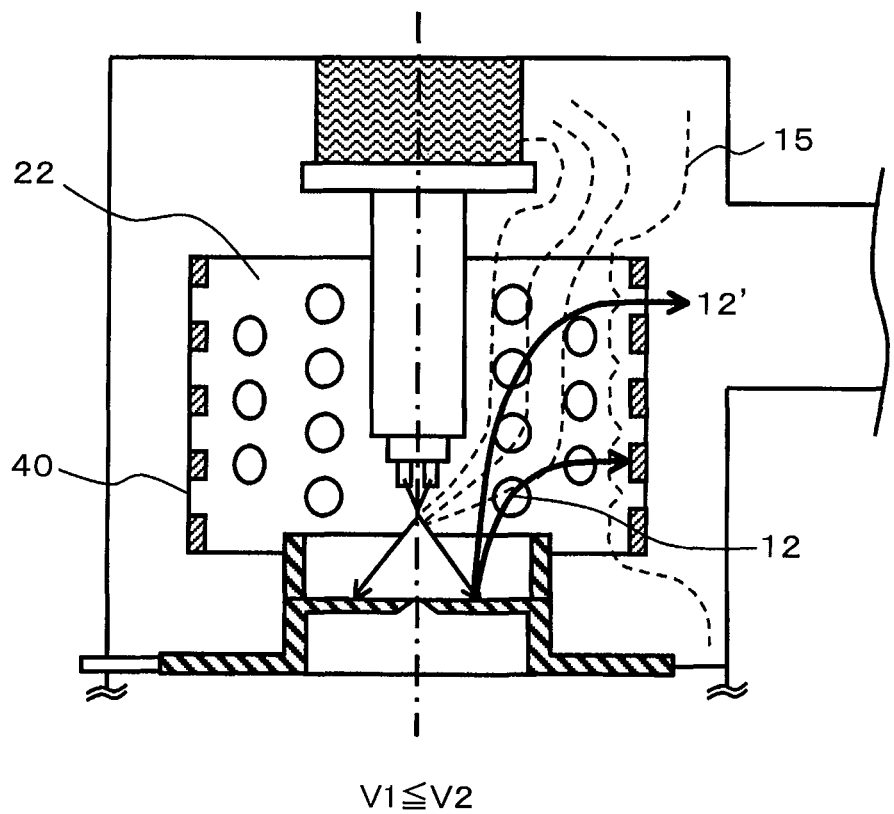
FIG. 22 is a diagram illustrating the distribution of electric fields where the potential of the shielding electrode is kept at or above the potential of the extraction electrode in the third embodiment.

FIG. 22 shows a typical distribution of electric fields in a case wherein the shielding voltage V2 is V1 V2. Under this condition of voltage application, a gravitation force is given to the back scattered electrons 12 to pull them into the shielding electrode 22 and capture them. In this case again, some electrons, represented by the back scattered electrons 12', pass through the opening 40. To address this possibility, the shielding rate is further raised by applying the structures of the shielding electrode shown in FIGS. 19 through 21 above.

Figure 23:
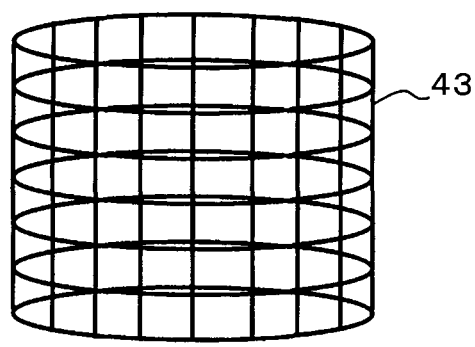
FIG. 23 is a diagram showing a modified version in which the shielding electrode in the third embodiment is formed in a mesh.

The opening 40 here is at least one round hole, but it may be a hole in some other shape and/or size; the greater the total area of the opening 40, the wider the route of evacuating the surroundings of the electron source 1 and the higher the conductance. For instance, by using a mesh-formed shielding electrode 43 as shown in FIG. 23, the route of vacuum evacuation can be secured and the conductance further enhanced. The greater the area of the opening relative to the area of the whole shielding electrode the higher the conductance, but there is a relationship of tradeoff in which the electric field created by the electrode would tend to be uneven and the face area that physically intercepts electrons is reduced to bring down the shielding rate.

Figure 24:
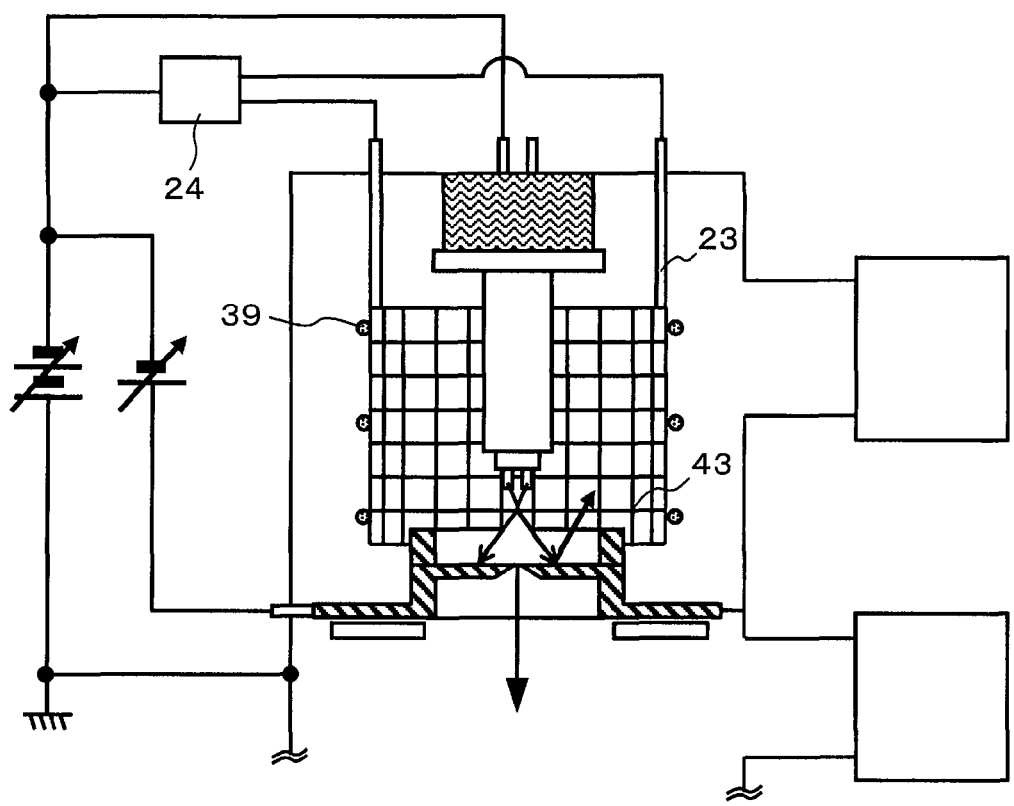
FIG. 24 is a diagram showing an electron gun in which the shielding electrode in the third embodiment is formed in a mesh.

FIG. 24 shows as an example the configuration of the electron gun in a case where the mesh-formed shielding electrode 43 is used. The mesh-formed shielding electrode 43 is arranged held by supporting rods 23. Under the condition of voltage application of V2<0, as a repulsive force works on the back scattered electrons 12 and the back scattered electrons can be readily restrained inside without allowing them to reach the shielding electrode, this mesh-formed shielding electrode is particularly effective.

Figure 40:
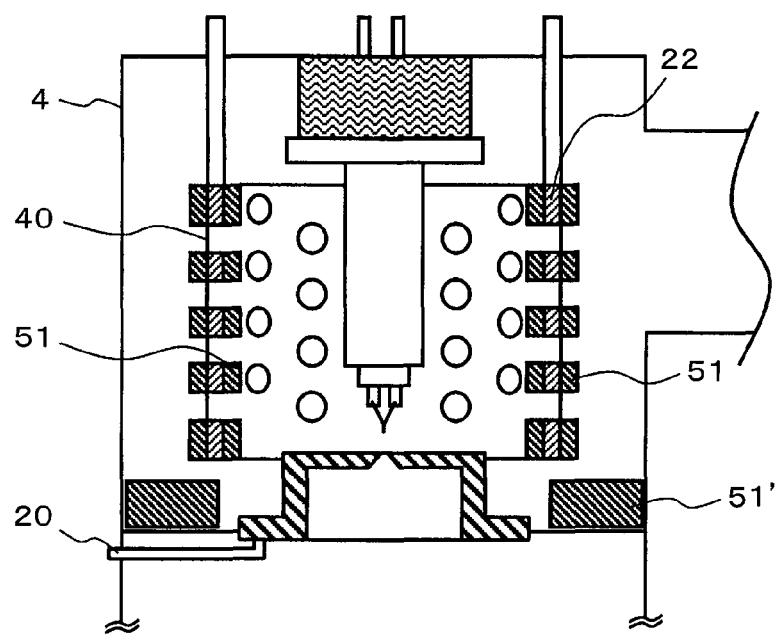
FIG. 40 is a configurational diagram of an electron gun pertaining to the third embodiment provided with a non-evaporative getter pump.

Since the conductance around the electron source is also enhanced in this embodiment as in Embodiment 1 and Embodiment 2, the use of a pump for ultrahigh vacuum use, such as a non-volatile getter pump or a titanium sublimation pump, in addition to the ion pump, would enable their evacuation capacity to be fully utilized to enhance the degree of vacuum around the electron source. By coating non-volatile getter pumps 51 on the surface of the shielding electrode 22 and arranging non-volatile getter pumps 51' in any desired positions within the vacuum vessel 4 as shown in FIG. 40 for instance, the evacuation capacity can be further raised and the degree of vacuum enhanced.

The shape of the shielding electrode is not limited to the round cylindrical structure but also may be, as in Embodiment 2, one having openings in the side faces of a polygonal cylinder or another having openings in the side faces of a plurality of electrodes of any desirable shape; the conductance is enhanced by the openings.

An electron gun which allows many back scattered electrons to be shielded against as in Embodiment 2 and whose conductance of vacuum evacuation is also enhanced by providing the openings can be provided by using this configuration.

This embodiment can provide a charged particle radiation device having a charged particle gun which, by having the shielding electrode of the cylindrical structure provided with a plurality of openings in its side faces, can prevent back scattered charged particles from spreading in the charged particle gun and, by sufficiently securing the route of evacuation around the source of charged particles, enhance the degree of vacuum around the source of charged particles and obtain a stable emission current. Further, a charged particle radiation device having a higher shielding effect against back scattered charged particles in a broader range can be provided by using a shielding electrode in a cylindrical structure having a length in the axial direction. Further, by having an opening in the side wall of a shielding electrode of a cylindrical structure, it is made possible to arrange the lower end of the shielding electrode closer to the extraction electrode than the source of charged particles, and a charged particle radiation device having a higher shielding effect against back scattered charged particles in a broader range can be thereby provided.

Further, by providing a protrusion in the opening provided in the side wall of the shielding electrode of a cylindrical structure, a charged particle radiation device having a high shielding effect against back scattered charged particles in a broader range can be provided. Further, by disposing a plurality of shielding electrodes of a cylindrical structure in a telescopic way and positioning the opening position of each out of alignment with those of others, a charged particle radiation device having a high shielding effect against back scattered charged particles in a broader range can be provided. Further, by tapering the shielding electrode of a cylindrical structure relative to the center axis, a charged particle radiation device having a high shielding effect against back scattered charged particles in a broader range can be provided. Also, by structuring the shielding electrode in a mesh-formed cylinder, a charged particle radiation device having a higher conductance of vacuum evacuation can be provided.

Embodiment 4

Now, Embodiment 4 will be described with reference to FIG. 25 and FIG. 26. Regarding this embodiment, an electron gun characterized by its structure simplified by electrically connecting the supporting parts of the electron source and the shielding electrode to dispense with the power source for simplification.

Figure 25:
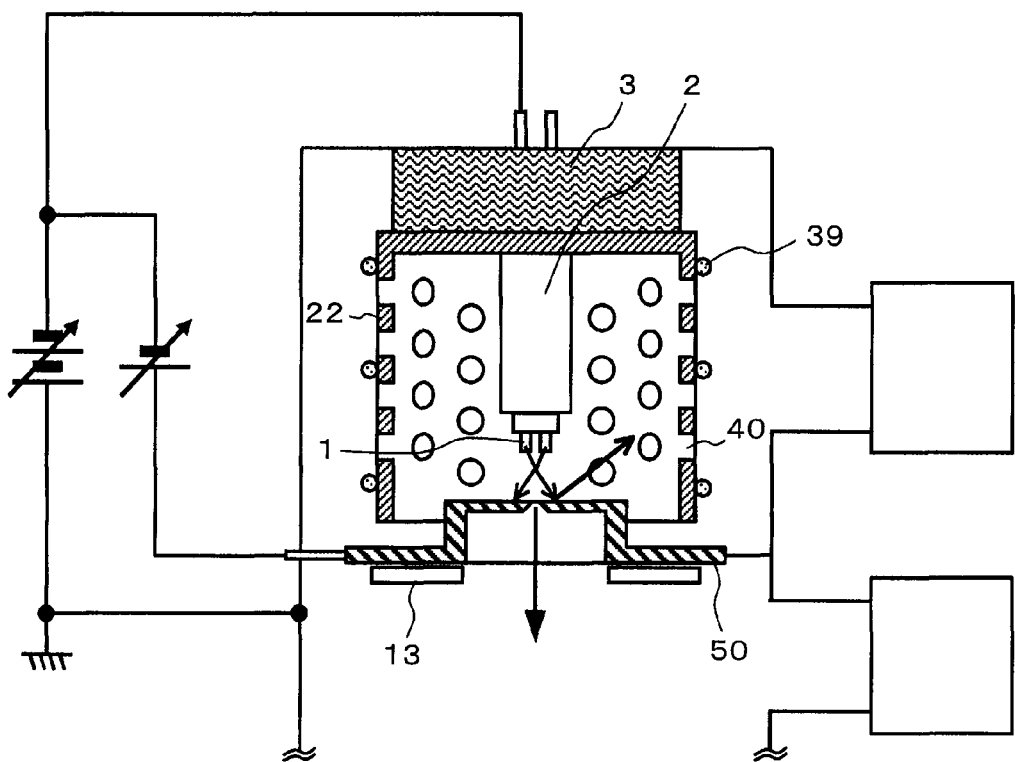
FIG. 25 is a configurational diagram of an electron gun pertaining to a fourth embodiment.

FIG. 25 shows the overall configuration of the electron gun of Embodiment 4. The configuration of the electron gun is substantially similar to Embodiments 1 through 3, and all the examples of modification, the examples of use and the method of mounting on the charged particle radiation device described with respect to Embodiments 1 through 3 also fit this embodiment.

This embodiment has a configuration in which the shielding electrode 22 of a cylindrical structure having the opening 40, with its length being in the axial direction, is integrated with the supporting part 2 of the electron source 1, and these elements are held by the insulator 3. The electron source 1 and the shielding electrode 22 are electrically connected to have the same potential, resulting in the advantage of dispensing with the shielding power source and any terminal applying a voltage to the shielding electrode. The shielding electrode 22 is fitted with the heater 39, and thermal desorption process is applied. Although the convex extraction electrode 50 described with reference to FIG. 5 is used here as the extraction electrode, the planar type extraction electrode 6 and the protrusion 49 described with reference to FIG. 4 may as well be used.

Figure 26:
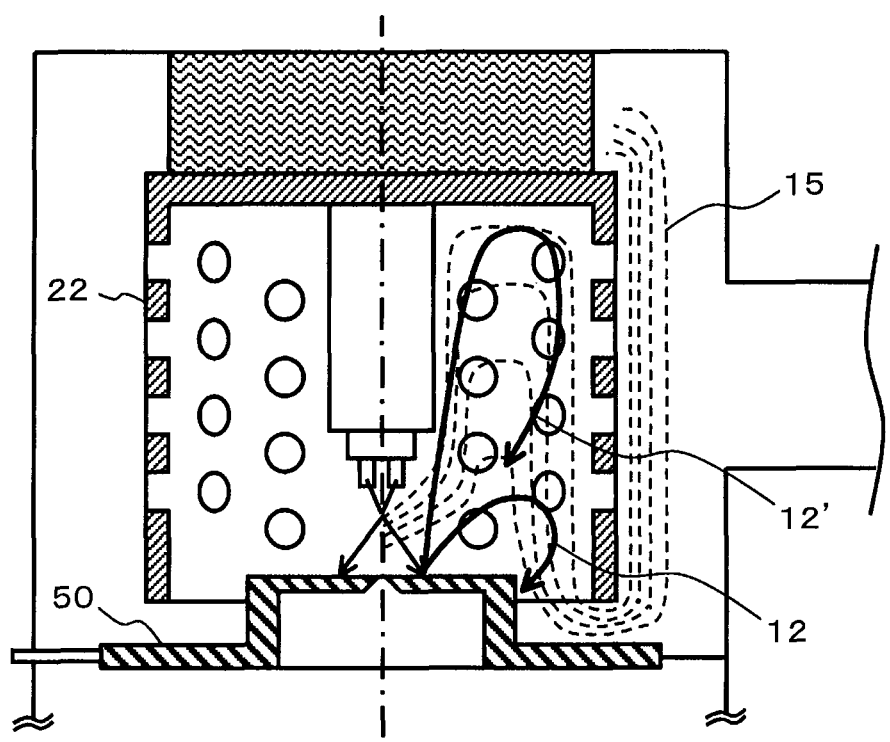
FIG. 26 is a diagram illustrating the distribution of electric fields in the fourth embodiment.

FIG. 26 shows the distribution of electric fields formed by the shielding electrode 22 of this configuration. This distribution of electric fields is substantially similar to that in Embodiment 3 where the shielding voltage V2 is 0, and the way of shielding is also similar. This configuration has, in addition to the advantage of dispensing with the shielding power source, another advantage that, as the integration of the supporting part 2 of the electron source and the shielding electrode results in a structure in which the part above the electron source is wholly covered by the shielding electrode with an expanded distribution of electric fields, enabling the back scattered charged particles proceeding upward as represented by the back scattered electrons 12' to be shielded against.

A repulsive force works on the back scattered electrons directed to the shielding electrode 22, and these electrons collide against the extraction electrode again. As the potentials of the electron source and the shielding electrode are the same, a small number of back scattered electrons collided against the shielding electrode. As the extraction electrode and the shielding electrode are subjected in advance to the thermal desorption process, ESD gas generated by the collision is minimized.

In this configuration, the mesh-formed shielding electrode 43 described with reference to FIG. 23 is effective for the shielding electrode 22, and its use enables the conductance to be enhanced. Further, by providing tapering or providing the protrusion to the shielding electrode as described with reference to FIGS. 19 through 21, it is made possible to vary as desired the distribution of electric fields in the shielding electrode and to facilitate confining of back scattered electrons farther inside. Also, the shielding electrode 22 can dispense with the opening 40. As the conductance deteriorates in this case, a sufficient space should be kept between the shielding electrode 22 and the extraction electrode to secure the evacuation route.

This embodiment makes it possible to provide an electron gun of a simplified configuration which dispenses with the shielding electrode with substantially the same shielding effect as Embodiment 3 where in the shielding voltage V2 is 0.

This embodiment can provide a charged particle radiation device having a charged particle gun which, by having the shielding electrode of the cylindrical structure provided with a plurality of openings in its side faces, can prevent back scattered charged particles from spreading in the charged particle gun and, by sufficiently securing the route of evacuation around the source of charged particles, enhance the degree of vacuum around the source of charged particles and obtain a stable emission current. Further, by using a configuration in which the supporting part of the charged particle source and the shielding electrode are integrated, a charged particle radiation device capable of shielding against back scattered charged particles proceeding upward can be provided. Further, by electrically connecting the charged particle source and the shielding electrode, the shielding power source and any terminal for applying voltages to the shielding electrode are dispensed with, making it possible to provide a charged particle radiation device simplified in hardware configuration.

Embodiment 5

Now, Embodiment 5 will be described with reference to FIGS. 27 through 29. Regarding this embodiment, an electron gun characterized by its structure simplified by electrically connecting an extraction electrode and a shielding electrode having a cylindrical structure having a plurality of openings on its sides and thereby dispensing with the power source.

Figure 27:
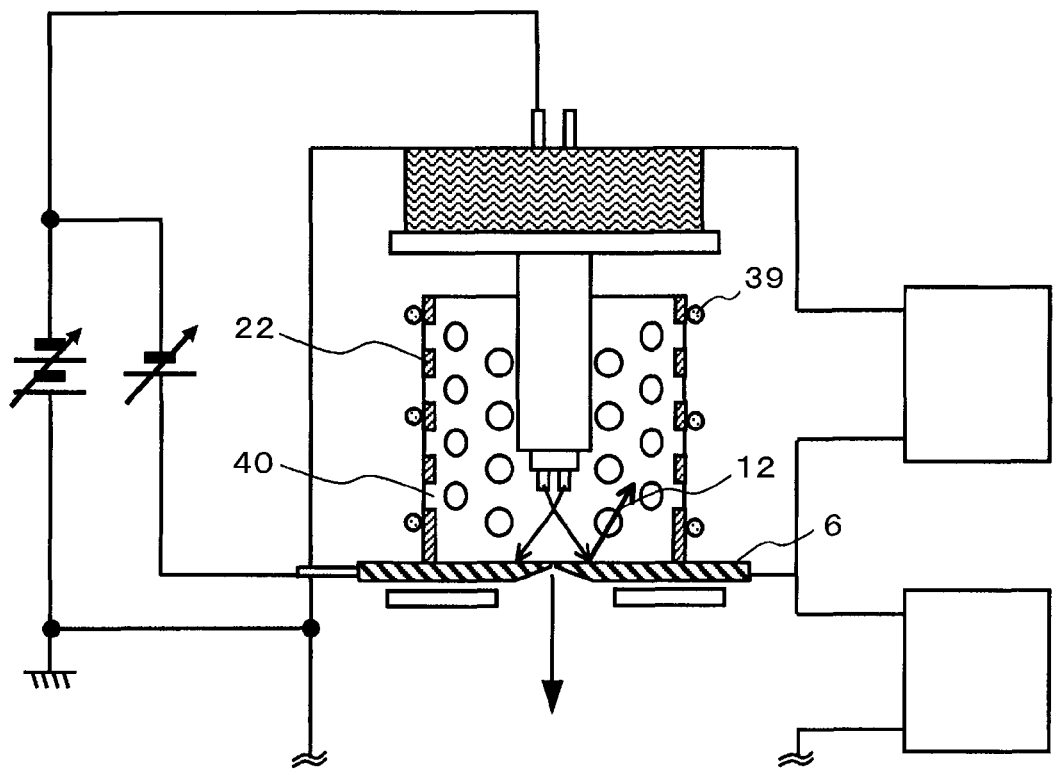
FIG. 27 is a configurational diagram of an electron gun pertaining to a fifth embodiment.

FIG. 27 shows the overall configuration of the electron gun of Embodiment 4. The configuration of the electron gun is substantially similar to Embodiments 1 through 3, and all the examples of modification, the examples of use and the method of mounting on the charged particle radiation device described with respect to Embodiments 1 through 3 also fit this embodiment. This embodiment has a configuration in which the shielding electrode of a cylindrical structure having the opening 40, with its length being in the axial direction, is connected to the extraction electrode 6. The potentials of the extraction electrode 6 and of the shielding electrode 22 are the same, resulting in the advantage of dispensing with the shielding power source, the terminal and the supporting rod for the shielding electrode 22. The shielding electrode 22 is subjected in advance to thermal desorption with the heater 39. Use of a material having high thermal conductivity, such as copper, could apply the thermal desorption process to the shielding electrode 22 with only the heater 13.

Figure 28:
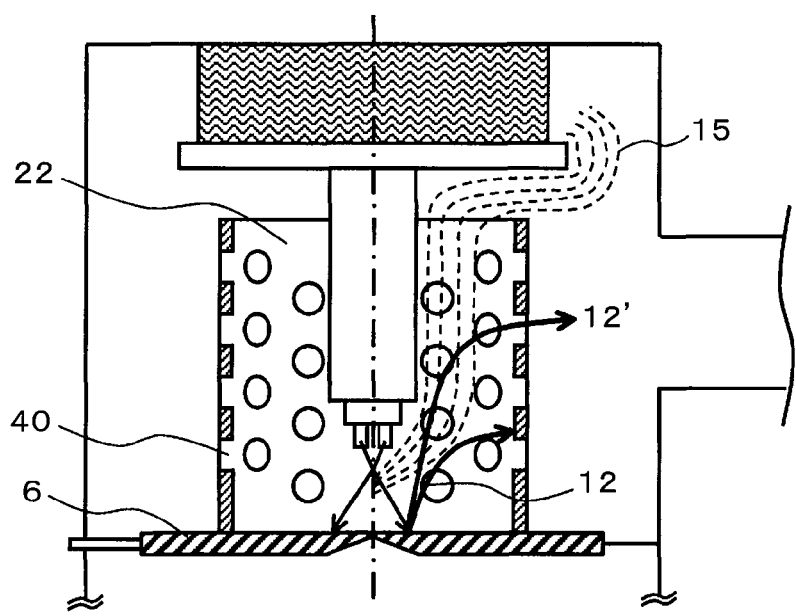
FIG. 28 is a diagram illustrating the distribution of electric fields in the fifth embodiment.

FIG. 28 shows a distribution of electric fields formed by the shielding electrode 22 of this configuration. This distribution of electric fields is substantially similar to that in Embodiment 3, where the shielding voltage V2 is equal to V1. No force works on back scattered electrons approaching the shielding electrode 22, and they directly collide against the shielding electrode 22. As some of the back scattered electrons pass outward through the opening 40, the structure of the shielding electrode described with reference to FIGS. 19 through 21 is modified, and the shielding rate is enhanced.

Figure 29:
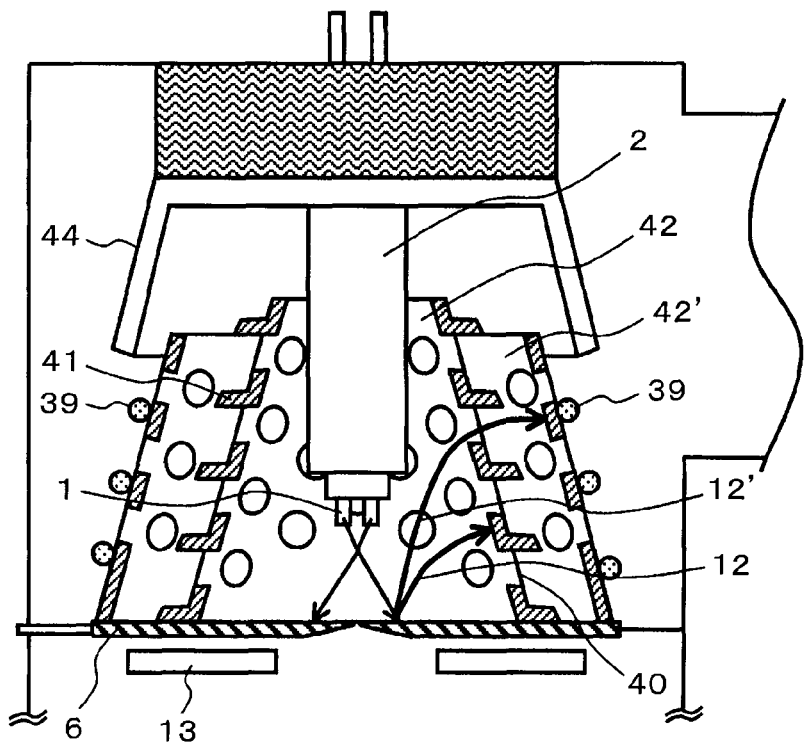
FIG. 29 is a diagram showing a modified version of the shielding electrode in the fifth embodiment.

FIG. 29 shows an example of modification of structural modification of the shielding electrode. Tapered shielding electrodes 42 and 42' are used as shielding electrodes, and a double structure is further used. The opening 40 of each electrode is out of alignment with those of others, and is provided with the protrusion 41. These modifications serve to enhance the shielding rate. Further, by providing a meeting electrode 44 of the same potential as the electron source, back scattered electrons proceeding upward are held inside. The sizes and shapes of these electrode structures are optimized by calculation the distribution of electric fields within the shielding electrode and the loci of back scattered electrons.

The shielding electrode 22 can dispense with the opening 40. As the conductance would deteriorate in this case, a sufficient space should be left unoccupied above the shielding electrode 22 to secure the route of evacuation.

This embodiment can provide an electron gun which has a substantially the same shielding effect as Embodiment 3 wherein the shielding voltage V2 is equal to V1 and no shielding power source is required.

This embodiment can provide a charged particle radiation device having a charged particle gun which, by having the shielding electrode of the cylindrical structure provided with an opening, can prevent back scattered charged particles from spreading in the charged particle gun and, by sufficiently securing the route of evacuation around the source of charged particles, enhance the degree of vacuum around the source of charged particles and obtain a stable emission current. Further, by electrically connecting the shielding electrode and the extraction electrode, the shielding power source, the terminal and the supporting rod for the shielding electrode are dispensed with, making it possible to provide a charged particle radiation device simplified in hardware configuration. Further, by arranging the meeting electrode above the source of charged particles, a charged particle radiation device that can hold inside the back scattered electrons proceeding upward can be provided.

Embodiment 6

Now, Embodiment 6 will be described with reference to FIG. 30. Regarding this embodiment, an electron gun characterized in that the electron source is irradiated with a laser beam or given heat or an electric field in the configurations of Embodiments 1 through 5 will be described.

Figure 30:
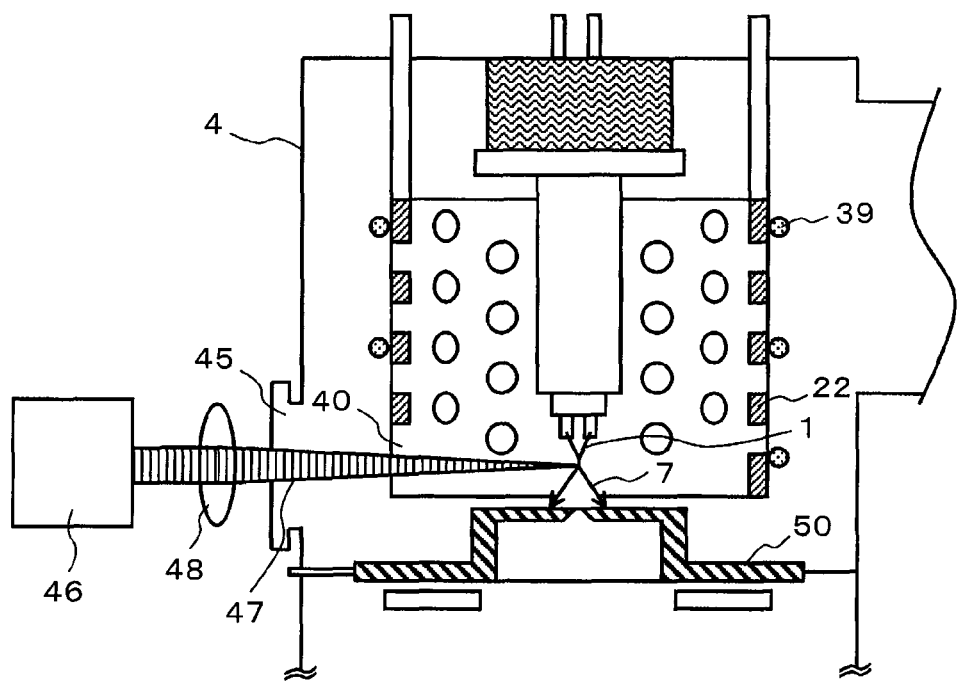
FIG. 30 is a configurational diagram of an electron gun pertaining to a sixth embodiment.

FIG. 30 shows the overall configuration of the electron gun of Embodiment 6. Although the structure of the shielding electrode used here is that in Embodiment 3, the configurations of the shielding electrodes used in Embodiments 1 through 5 can also be used. This embodiment is characterized in that a view port 45 is provided in the vacuum vessel 4, a laser beam 47 emitted from a laser beam source 46 is condensed with a condenser lens 48, led into the vacuum vessel 4 through the view port 45 and further irradiates the electron source 1 through the opening 40 of the shielding electrode 22.

In the electron configuration in the prior art, the electron gun is surrounded by a cup-shaped electrode or the like, making it impossible to directly look at the electron source from outside the electron gun through a window such as a view port. However, by using the shielding electrodes shown in Embodiments 1 though 5, the electron gun is made directly visible from outside, and the electron gun can be irradiated with a laser.

In this configuration, flashing to desorb the gas adsorbed to the surface of the electron source and purify it is accomplished by using the condensed laser beam 47. According to the prior art, the whole electron source was heated with Joule heat by electrifying the electron source itself, but the use of the laser beam enables only the tip of the electron source to be heated and thereby eliminate the deformation and axial shearing of the electron source. Incidentally, the suitable laser is a semiconductor laser.

Furthermore, by accomplishing electric field evaporation while being assisted with the laser beam, the electron source can be purified. While irradiating the electron source 1 with the laser beam 47, a high positive voltage is applied to the electron source 1. By this method, electric fields deriving from the laser beam are applied to the tip of the electron source to make possible field evaporation with a lower voltage than according to the prior art.

Further, the electron source 1 is irradiated with the condensed laser beam 47, and fields are concentrated at the tip of the electron source by further applying the extraction voltage. The laser-derived fields are thereby applied to the tip of the electron source 1 to enable the electron beam 7 to be obtained with a lower extraction voltage than according to the prior art. Further, by applying the lower extraction voltage emitted by electrons to the electron source and irradiating in a pulse shape the electron source beam with a laser having sufficient electric fields for the emission of electrodes, a pulse-shaped electron beam synchronized with the laser can be obtained.

In this embodiment, the laser beam source 46 and the condenser lens 48 may as well be installed within the vacuum vessel 4. Also, the shape and number of needed lenses differs with the strength, monochromatism and condensed diameter of the laser; one or more lenses may be provided, or no lens at all is also conceivable. Further, this configuration beam can be applied not only to a laser or any directional energy source.

As a result of causing an electron microscope having a shielding electrode of a cylindrical structure having an opening in the side face to emit an electron beam after irradiating the electron source with the laser, a similar effect to any of the embodiments was obtained. Furthermore, a more stable emission current was obtained.

This embodiment can provide a charged particle radiation device having a charged particle gun which, by having the shielding electrode of the cylindrical structure provided with a plurality of openings in the side faces, can prevent back scattered charged particles from spreading in the charged particle gun and, by sufficiently securing the route of evacuation around the source of charged particles, enhance the degree of vacuum around the source of charged particles and obtain a stable emission current. Further, by being provided with a directional energy source for giving heat or electric fields to the tip of the source of charged particles, a charged particle radiation device capable of obtaining a charged particle beam with a low extraction voltage can be provided.

Figure 41:
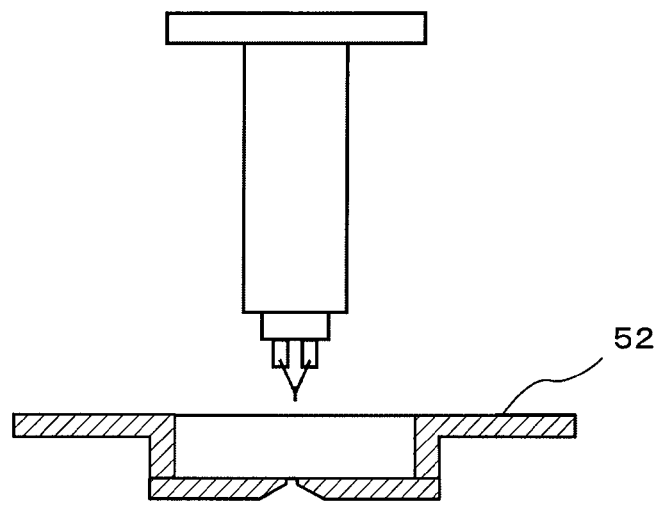
FIG. 41 is a diagram showing a modified version in which the extraction electrode of the first embodiment is in a concave shape.

The configurations described for Embodiments 1 through 6 above can be used for other charged particle radiation device such as a scanning/transmission electron microscope and a mirror projection microscope. The electron source for use in these configurations may use such materials as lanthanum hexaboride (LaB6), carbon nano tube or some others and may have other crystalline faces than <310>, <111> and <100>. The gap between the electron source and the extraction electrode may be 1 mm or less, and the structure of the extraction electrode may be shaped like a dish as shown in FIG. 41. The materials of or for coating the surfaces of the extraction electrode and the shielding electrode may be, besides gold, silver, copper, aluminum, titanium or alloys thereof, materials generating little ESD gas such as titanium nitride and beryllium copper. Further, by coating the surfaces of the extraction electrode and the shielding electrode with a getter material such as non-evaporative getter, the vacuum evacuation capacity within the electron gun is increased.

In the configurations using the shielding electrode of the cylindrical structure shown in Embodiment 2 through Embodiment 4, by extending the shielding electrode 22 to underneath the horizontal height of the convex extraction electrode 50 as shown in FIG. 26, the distribution of electric fields is enabled to apply force even to back scattered electrons turned in orbit by the shielding electrode and directed toward the vicinities of the side face of the convex extraction electrode, resulting an enhanced shielding effect. Further, also in the case of providing the extraction electrode with the protrusion 49 as shown in FIG. 16, extending the shielding electrode 22 to underneath the horizontal height of the upper face of the protrusion 49 gives a similar effect.

Figure 42:
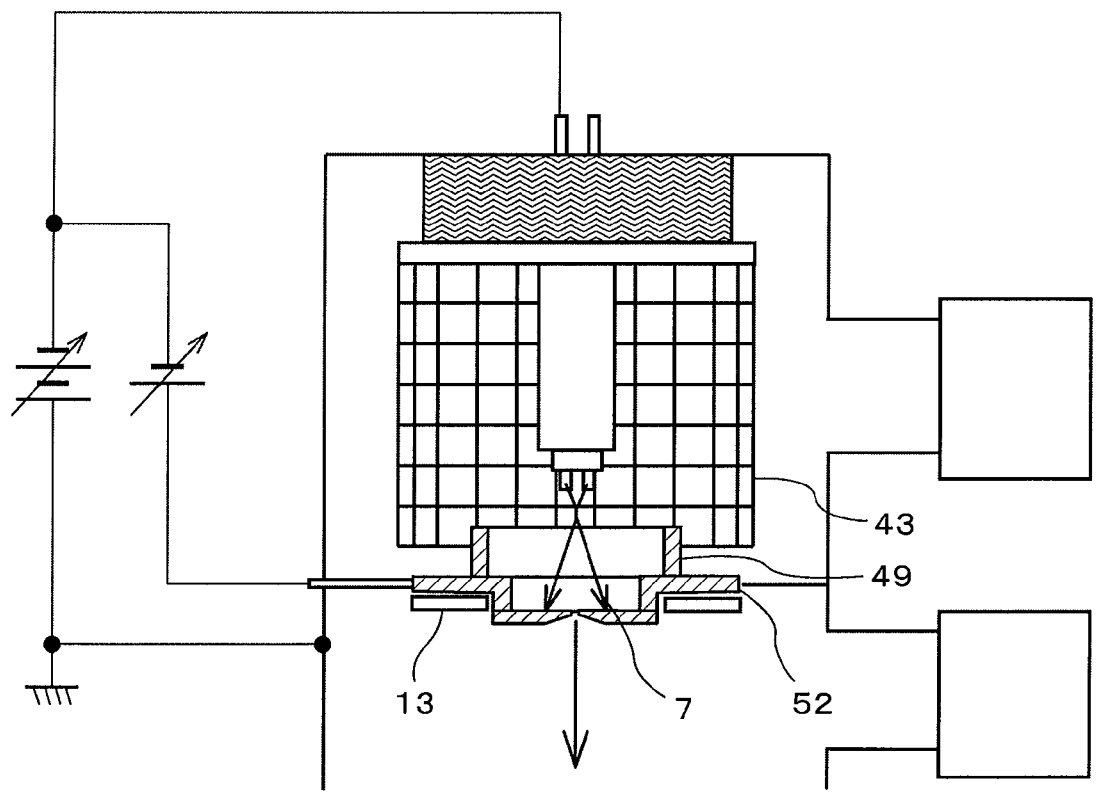
FIG. 42 is a diagram showing a modified version of the shielding electrode in the fourth embodiment.

In the configuration of Embodiment 4, the shape of the shielding electrode can be altered as desired; by using the mesh-formed shielding electrode 43 described with reference to FIG. 23 as the shielding electrode as shown in FIG. 42, the conductance can be further enhanced. Also, the extraction electrode can be altered to any desired configuration intended for restraining back scattered electrons and improving the conductance, such as providing a concave extraction electrode 52 with the protrusion 49.

REFERENCE SIGNS LIST

1: Electron source
2: Supporting part
3: Insulator
4: Vacuum vessel
5: Ion pump
6: Extraction electrode
7: Electron beam
8: Aperture
9: Second vacuum chamber
10: Probe current
11: Electron stimulated desorption gas
12: Back scattered electrons
13: Heater
14: Cup-shaped extraction electrode
15: Equipotential lines
16: First vacuum chamber
17: Ion pump
18: Terminal
19: Accelerating power source
20: Terminal
21: Extraction power source
22: Shielding electrode
23: Supporting rods
24: Shielding power source
25: Accelerating electrode
26: Ion pump
27: Third vacuum chamber
28: Object lens
29: Turbo molecular pump
30: Sample chamber
31: Focusing electrode
32: Controller
33: Sample stage
34: Sample
35: Detector
36: Display
37: Manipulator
38: flashing power source
39: Heater
40: Opening
41: Protrusion
42: Tapered shielding electrode
43: Mesh-formed shielding electrode
44: Meeting electrode
45: View port
46: Laser beam source
47: Laser beam
48: Condenser lens
49: Protrusion
50: Convex extraction electrode
51: Non-volatile getter pump
52: Concave extraction electrode

The invention claimed is:

1. A charged particle radiation device having a charged particle source, an extraction electrode for extracting charged particles from the charged particle source, a sample holding means for holding a sample to be irradiated with charged particles extracted by the extraction electrode, a charged particle optical system for irradiating the sample held on the sample holding means with the charged particles that are extracted, a first evacuation means for evacuating a first vacuum chamber in which the charged particle source is arranged, and a second vacuum chamber, independent of the first vacuum chamber, for evacuating a second vacuum chamber connected to the first vacuum chamber, the charged particle radiation device further having:
  a shielding electrode of a cylindrical structure that is so arranged as to surround the charged particle source and shield against the procession of back scattered charged particles from the extraction electrode, wherein:
  the top end and the bottom end of the cylinder of the cylindrically structured shielding electrode are open to the inside of the first vacuum chamber.

2. The charged particle radiation device according to claim 1, wherein:
  the shielding electrode is arranged farther away than the shortest distance between the tip of the charged particle source and the extraction electrode.

3. The charged particle radiation device according to claim 1, wherein:
  the extraction electrode has a protrusion smaller than the shortest distance between the tip of the charged particle source and the extraction electrode.

4. The charged particle radiation device according to claim 1, wherein:
  the extraction electrode is a convex extraction electrode.

5. The charged particle radiation device according to claim 1, wherein:
  the height of the tip of the charged particle source is arranged within the range in the height direction of the first evacuation means.

6. The charged particle radiation device according to claim 1, wherein:
  the first evacuation means is an entrapment type pump.

7. The charged particle radiation device according to claim 6, wherein:
  the entrapment type pump is a non-evaporative getter pump or a titanium sublimation pump.

8. A charged particle radiation device having a charged particle source, an extraction electrode for extracting charged particles from the charged particle source, a sample holding means for holding a sample to be irradiated with charged particles extracted by the extraction electrode, a charged particle optical system for irradiating the sample held in the sample holding means with the charged particles that are extracted, a first evacuation means for evacuating a first vacuum chamber in which the charged particle source is arranged, and a second vacuum chamber, independent of the first vacuum chamber, for evacuating a second vacuum chamber connected to the first vacuum chamber, the charged particle radiation device further having:
a shielding electrode of a cylindrical structure that is so arranged as to surround the charged particle source and shield against the procession of back scattered charged particles from the extraction electrode, wherein:
at least one opening is provided in the side face of the cylinder of the cylindrically structured shielding electrode.

9. The charged particle radiation device according to claim 8, wherein:
the shielding electrode is arranged farther away than the shortest distance between the tip of the charged particle source and the extraction electrode.

10. The charged particle radiation device according to claim 8, wherein:
the plurality of openings provided in the side of the cylinder are provided with protrusions directed outside the cylinder.

11. The charged particle radiation device according to claim 8, wherein:
the shielding electrodes are arranged in a plurality in a telescopic way, and
the opening provided in each shielding electrode is arranged in a position out of alignment with others not to superpose correspondingly to the loci of the back scattered charged particles.

12. The charged particle radiation device according to claim 8, wherein:
the side of the shielding electrode has an inclination relative to the center axis thereof.

13. The charged particle radiation device according to claim 8, wherein:
the shielding electrode has a mesh structure.

14. The charged particle radiation device according to claim 8, wherein:
power sources capable of independently applying voltages to the shielding electrode, the charged particle source and the extraction electrode are installed.

15. The charged particle radiation device according to claim 8, wherein:
the power source to apply a voltage to the shielding electrode is common to the power source to apply a voltage to the charged particle source.

16. The charged particle radiation device according to claim 8, wherein:
the power source to apply a voltage to the shielding electrode is common to the power source to apply a voltage to the extraction electrode.

17. The charged particle radiation device according to claim 8, further having:
an electrode that restrains the back scattered charged particles toward above the shielding electrode.

18. The charged particle radiation device according to claim 8, further having:
a directional energy source that gives heat or electric fields to the tip of the charged particle source.

19. The charged particle radiation device according to claim 18, wherein:
the directional energy source is a semiconductor laser.

20. The charged particle radiation device according to claim 8, further having:
a means to heat the shielding electrode.

* * * * *